(12) United States Patent
Tanaka

(10) Patent No.: US 7,535,299 B2
(45) Date of Patent: *May 19, 2009

(54) HIGH-FREQUENCY AMPLIFICATION CIRCUIT

(75) Inventor: Akio Tanaka, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/021,965

(22) Filed: Jan. 29, 2008

(65) Prior Publication Data

US 2008/0129385 A1 Jun. 5, 2008

Related U.S. Application Data

(62) Division of application No. 10/885,096, filed on Jul. 7, 2004, now Pat. No. 7,389,091.

(30) Foreign Application Priority Data

Jul. 8, 2003 (JP) ............... 2003-271690

(51) Int. Cl.
H03F 3/04 (2006.01)

(52) U.S. Cl. ...................... 330/250; 455/126

(58) Field of Classification Search ............. 330/250, 330/305; 455/126, 193.2, 127.3, 192.1, 118, 455/102

See application file for complete search history.

(56) References Cited

U.S. PATENT DOCUMENTS 5,347,537 A * 9/1994 Mori et al. ............... 375/142
6,218,909 B1 * 4/2001 Eban ....................... 331/117 R
2002/0089380 A1 7/2002 Fujioka et al.
2003/0022638 A1 1/2003 Imai et al.
2005/0014476 A1 1/2005 Oono et al.
2006/0051038 A1 * 3/2006 Imai et al. ................. 385/122

FOREIGN PATENT DOCUMENTS

| JP | 49-46246 A | 12/1974 |
|---|---|---|
| JP | 54-87849 A | 7/1979 |
| JP | 2002-314360 A | 10/2002 |
| JP | 2003-504906 A | 2/2003 |
| JP | 2004-522350 A | 7/2004 |

OTHER PUBLICATIONS

"Nikkei Electronics", Issue of Mar. 31, 2003, pp. 30 to 31.
"Microwave Transistor" by Yoichiro Takayama, IEICE pp. 164 to 174 and 184 to 192.

(Continued)

*Primary Examiner*—Henry K Choe
(74) *Attorney, Agent, or Firm*—Sughrue Mion, PLLC

(57) ABSTRACT

A resonance circuit comprising, for example, an inductor and a plurality of capacitors is provided as a load of a transistor. The capacitors are changed over by a switch. As the capacitors are changed over by the switch, a resonance frequency is changed according to the invention the frequency hopping of an input signal. To cancel ringing that occurs at the time of the switching action, a transistor which cancels gate feed through is added to the switch. An inductor is provided at the gate in order to suppress a gain reduction and an increase in noise factor in a high-frequency range. This provides a compact, wide-band amplifier which has low noise, a wide gain and low power consumption.

14 Claims, 23 Drawing Sheets

OTHER PUBLICATIONS

"A 1 GHz CMOS RF front-end IC for a direct-conversion wireless receiver" by A. Rofougaran, IEEE Journal of Solid-State Circuits, vol. 31 Issue 7, Jul. 1996, pp. 880 to 889.

"A front-end filter with automatic center frequency tuning circuitry" by Y. Chang, Southwest Symposium on Mixed-Signal Design, 2001, pp. 28 to 31.

* cited by examiner

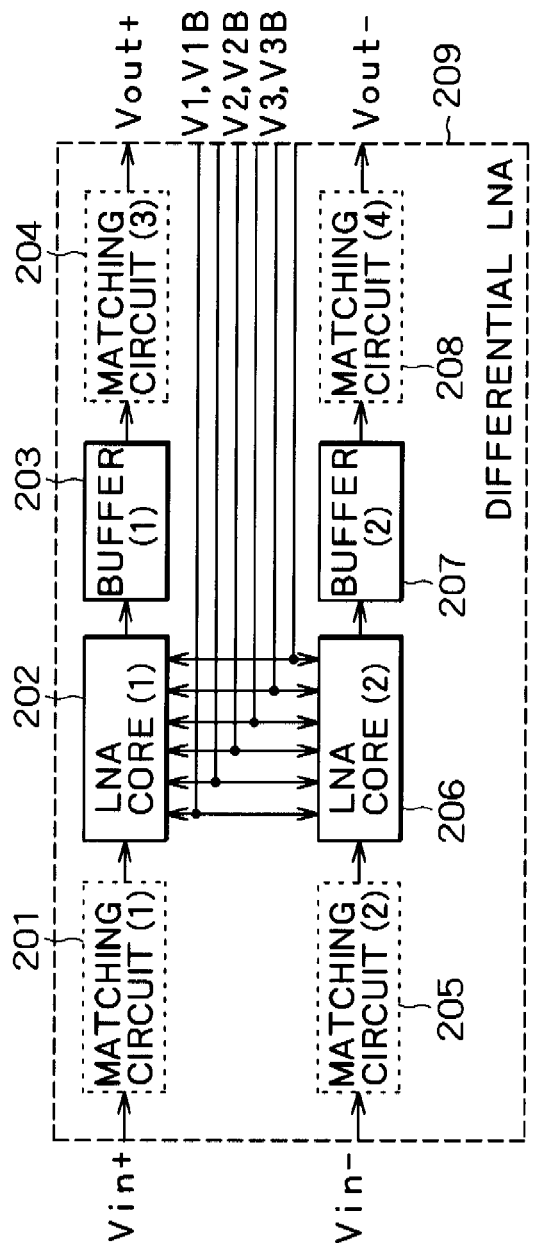
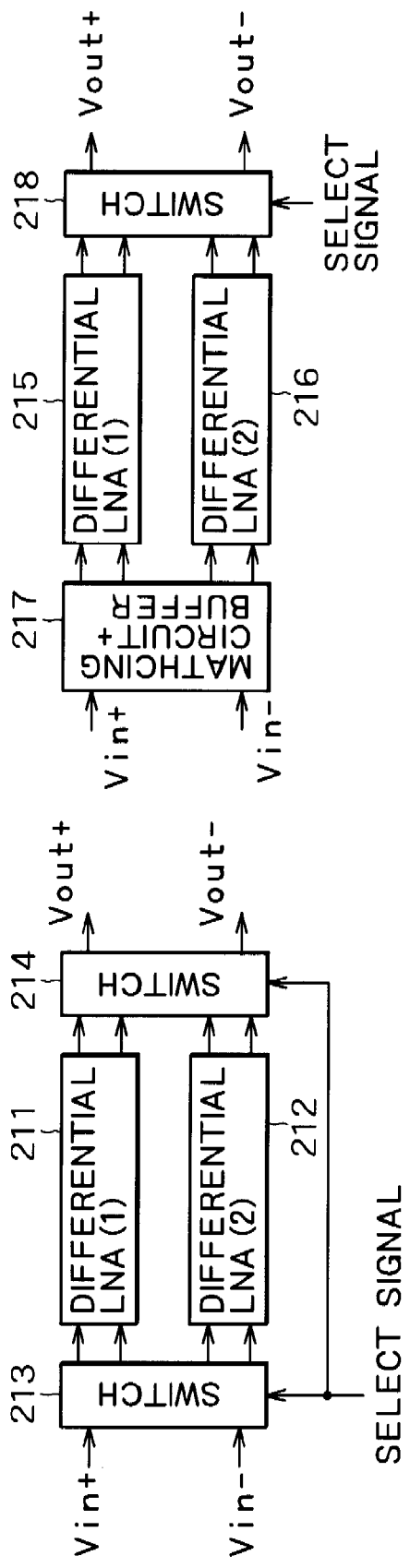
FIG. 2A  FIG. 2B  FIG. 2C

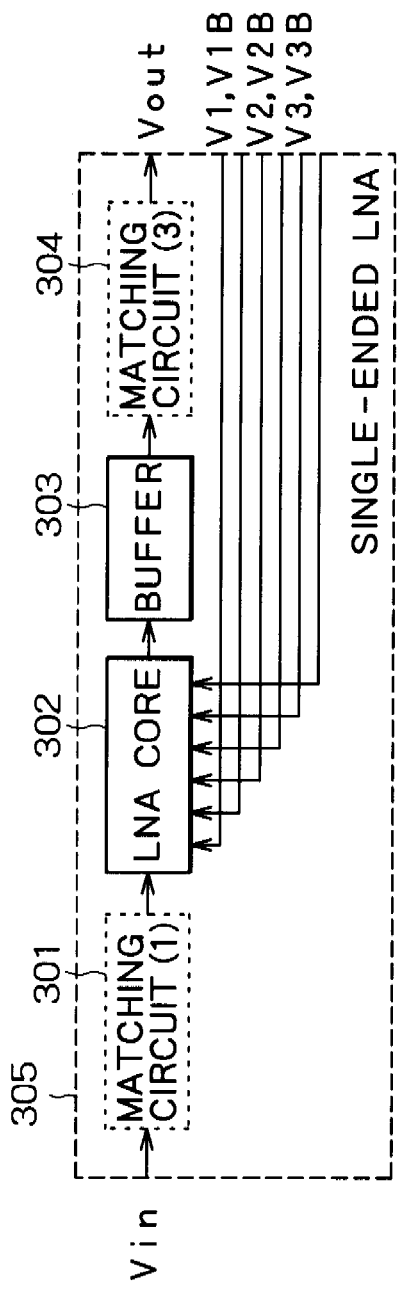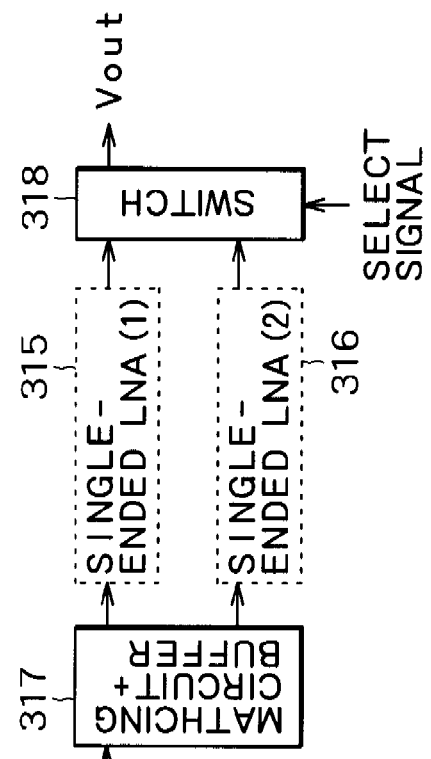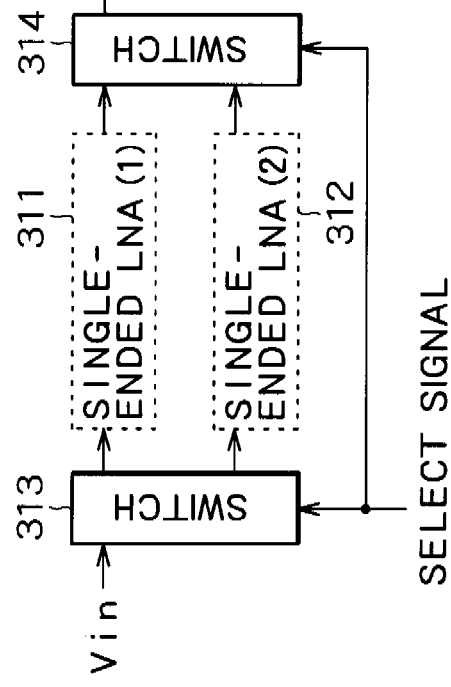

FIG. 4
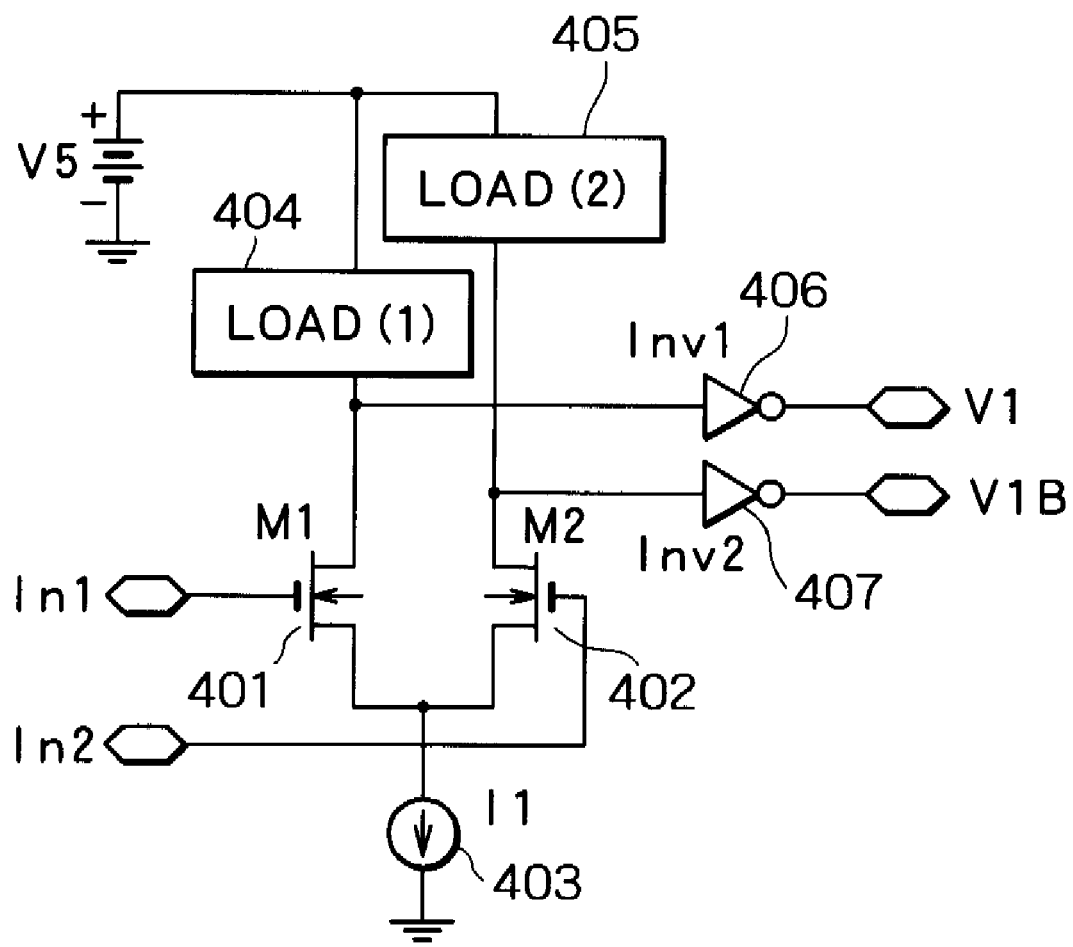
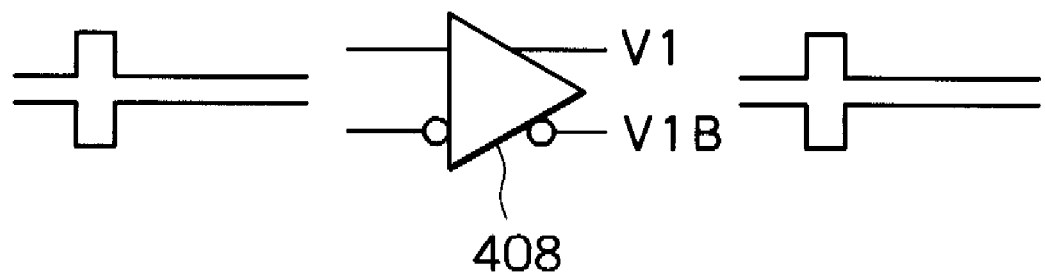

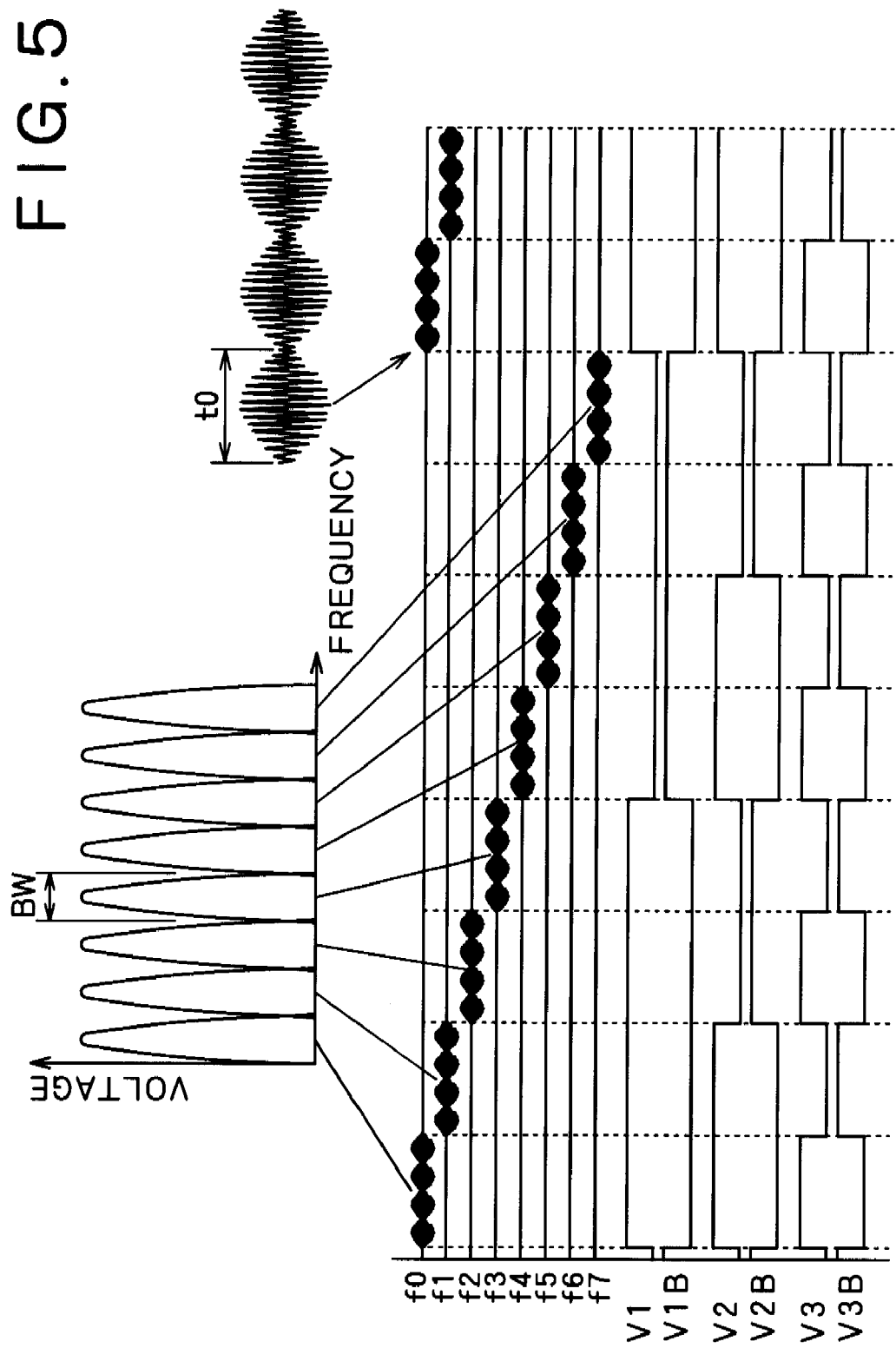

HIGH-FREQUENCY AMPLIFICATION CIRCUIT

BACKGROUND OF THE INVENTION

1. Field of the Invention

The present invention relates to an amplification circuit which amplifies a high-frequency signal, and, more particularly to a wide-band high-frequency amplification circuit which amplifies a signal over a wide frequency band. The high-frequency amplification circuit according to the present invention is adaptable as a wide-band amplification circuit to both wireless communication and cable communication which demand a high transfer rate.

2. Description of the Related Art

Recently, wide-band communication is needed in wireless communication and wide-band communication of 54 Mbps is made into practical use according to the IEEE 802.11a standards. Further, standardization of an ultra wide band (UWB) which is for wireless communication of 1 Gbps class is being made in the IEEE 802.15.TG3a standards. In such wireless communication, the occupied frequency band that is needed for wireless transmission becomes very wide as apparent from the Shannon's theorem. For example, a wide frequency band of 3.1 GHz to 10.6 GHz is used in UWB (see, for example, "Nikkei Electronics", Issue of Mar. 31, 2003 (pp 30 to 31)). However, there has never been a wide-band wireless communication at a frequency approximately three times the lower limit frequency, i.e., over three octaves.

FIG. 25 is a timing chart for a UWB wireless system. In a UWB wireless system called a multi-band system, for example, frequency band ranging from 3.1 GHz to 10.6 GHz are separated into, for example, eight frequency bands each having a band of 500 MHz or so, as shown in FIG. 25, and a wide band is covered by hopping the eight frequency bands sequentially at a high speed.

A resistance matching amplification circuit, a negative feedback amplification circuit, a traveling-wave amplification circuit and so forth are known as a circuit which amplifies a wide-frequency signal (see, for example, "Microwave Transistor" by Yoichiro Takayama, IEICE (pp 164 to 174 and 184 to 192)). However, the resistance matching amplification circuit should face a problem of an increased noise factor (NF), the negative feedback amplification circuit should face a problem of an increase in NF and gain reduction, and the traveling-wave amplification circuit should face a problem that the size of the distribution line would increase.

By way of contrast, a so-called gate-grounded circuit in which the gate of an MOSFET is grounded or a so-called base-grounded circuit in which the based of a bipolar transistor is grounded has an advantage such that input matching is easily taken (see, for example, "A 1 GHz CMOS RF front-end IC for a direct-conversion wireless receiver" by A. Rofougaran, IEEE Journal of Solid-State Circuits (Volume 31 Issue 7, July 1996, pp 880 to 889).

There is also an amplification circuit which is given a band-pass characteristics by setting an inductor and a capacitor as loads of a transistor, as shown in FIG. 26 (see, for example, "A front-end filter with automatic center frequency tuning circuitry" by Y. Chang, Southwest Symposium on Mixed-Signal Design (2001, pp. 28 to 31). This example has a structure such that a varactor is used as a capacitor C1 whose capacitance is changed to match the center frequency of the band-pass characteristic chip by chip in accordance with a change in center frequency due to a process variation.

When a signal in a wide band ranging from 3.1 GHz to 10.6 GHz is amplified with low noise, however, the resistance matching amplification circuit, the negative feedback amplification circuit and the traveling-wave amplification circuit have the problems of an increase in NF, gain reduction and an increase in size.

While the gate-grounded circuit and the base-grounded circuit have an advantage of easy input matching, the advantage does not directly lead to adaptation of the load characteristics and transistor characteristics to a wide band.

Further, the example in FIG. 26 copes with a process-originated variation in band-pass center frequency, but neither aims at adapting the band-pass center frequency to a wide band nor has a structure designed to cope with the adaptation of the band-pass center frequency to a wide band.

SUMMARY OF THE INVENTION

Accordingly, it is an object of the present invention to provide a high-frequency amplification circuit or a low-noise amplifier (LNA) whose amplification circuit is adapted to a wide band and which has low NF, a small size and low power consumption.

A high-frequency amplification circuit according to the first aspect of the present invention comprises a first transistor; and a resonance circuit including an inductance element and a plurality of capacitance elements, connected as loads to the first transistor, and a plurality of switches which changes that of the capacitance elements which is connected as a load.

It is preferable that in the high-frequency amplification circuit, the plurality of switches should include a plurality of second transistors to whose control terminals a first pulse for controlling the second transistors is applied; and a plurality of third transistors which are connected to the second transistors and to whose control terminals a second pulse having a polarity opposite to that of the first pulse is applied.

According to the invention, a resonance circuit comprised of an inductor element and capacitor elements is used as the load of a first transistor and the capacitor elements are designed in such a way as to be switched from one to another by switches. The switching of the capacitance elements can allow the resonance frequency to be changed according to the frequency hopping of the input signal. It is preferable that to cancel ringing that occurs at the time of the switching action, a transistor which cancels gate feed through should be added to the switch. It is also preferable that an inductance element should be provided at the gate in order to suppress a gain reduction and an increase in NF in a high-frequency range.

In the high-frequency amplification circuit, the third transistors may have a polarity opposite to that of the second transistors.

In the high-frequency amplification circuit, the capacitance elements may have capacitances different from one another in a binary value.

In the high-frequency amplification circuit, the first transistor may have a control terminal grounded with respect to an alternate current signal.

In the high-frequency amplification circuit, there may be two circuits each including the first transistor, the inductance element, the plurality of capacitance elements and the plurality of switches, and two signals different in phase from each other by approximately 180 degrees may respectively be input to the two circuits.

In the high-frequency amplification circuit, there may be two circuit sets each including the two circuits, and a switch which switches between outputs of the two circuit sets.

In the high-frequency amplification circuit, there may be two sets of circuits each including the first transistor, the inductance element, the plurality of capacitance elements and the plurality of switches, and a switch which switches between outputs of the two sets of circuits.

The high-frequency amplification circuit may further comprise a current mode logic of a differential structure which generates the first pulse and the second pulse.

The high-frequency amplification circuit may further comprise a pulse generating circuit which generates the first pulse and the second pulse in synchronism with frequency hopping of an input signal.

In the high-frequency amplification circuit, the second transistors may be NMOS transistors, and the third transistors may be PMOS transistors.

A high-frequency amplification circuit according to the second aspect of the present invention comprises a resonance circuit which is connected as a load to a fourth transistor and whose resonance frequency changes in synchronism with an input signal.

A high-frequency amplification circuit according to the third aspect of the present invention comprises a matching circuit connected to a fifth transistor and having a control terminal for controlling the fifth transistor in synchronism with an input signal.

A high-frequency amplification circuit according to the fourth aspect of the present invention comprises a filter connected to a sixth transistor and having a control terminal for controlling the sixth transistor in synchronism with an input signal.

A high-frequency amplification circuit according to the fifth aspect of the present invention comprises a capacitance element, a plurality of inductance elements and a plurality of switches, all connected as loads to a seventh transistor, the switches being connected to the inductance elements.

A high-frequency amplification circuit according to the sixth aspect of the present invention comprises an inductance element which is connected as a load to an eighth transistor and is controlled by a voltage and a current in synchronism with an input signal.

A high-frequency amplification circuit according to the seventh aspect of the present invention comprises a capacitance element which is connected as a load to a ninth transistor and is controlled by a voltage and a current in synchronism with an input signal.

A high-frequency amplification circuit according to the eighth aspect of the present invention comprises a transistor which operates in a gate-grounded mode; a first inductor connected between a gate of the transistor and a power supply; and a load connected to a drain of the transistor.

In this high-frequency amplification circuit, an inductance of the first inductor may range from 0.5 nH to 2 nH.

According to the ninth aspect of the present invention, there is provided a wireless communication system which performs communications in such a way as to hop a frequency quickly and has a high-frequency amplification circuit comprising an inductance element, a plurality of capacitance elements and a plurality of switches, all connected as loads to a transistor, the switches being connected to the capacitance elements.

A high-frequency amplification circuit according to the tenth aspect of the present invention has a filter connected to an amplification circuit, having a control terminal for controlling the amplification circuit in synchronism with an input signal, and including an inductance element; a plurality of capacitance elements; a plurality of switches which are connected to the plurality of capacitance elements and are tenth transistors to whose control terminals a third pulse for controlling the tenth transistors is applied to the tenth transistors; and a plurality of eleventh transistors which are connected to the tenth transistors and apply a fourth pulse having a polarity opposite to that of the third pulse to the control terminals of the tenth transistors.

The present invention brings about the following six effects.

The first effect is that the gain characteristic has a bandpass characteristic so that the gain of the desired frequency can be increased while the gains of the other frequencies can be reduced. What is more, the resonance frequency (center frequency) can be changed fast.

The second effect is that a reflection characteristic can be reduced over a wide band.

The third effect is that an NF can be set to a low value of 3 or so.

The fourth effect is that such a high gain and low NF can be achieved by a small circuit area.

The fifth effect is that such an excellent characteristic can be acquired with low power consumption of 5 mW or so.

The sixth effect is that the use of a wide-band LNA according to the invention can realize a compact communication system which has low power consumption and a low bit error rate (BER) and is unlikely to cause interference or is insusceptible to applied interference.

BRIEF DESCRIPTION OF THE DRAWINGS

FIGS. 2A to 2C are block diagrams of the high-frequency amplification circuit according to the first embodiment of the invention;

FIGS. 3A to 3C are a block diagrams of the high-frequency amplification circuit according to the first embodiment of the invention;

FIG. 4 shows a CML circuit to be used in the first embodiment of the invention;

FIG. 5 is a timing chart for the high-frequency amplification circuit according to the first embodiment of the invention;

DETAILED DESCRIPTION OF THE PREFERRED EMBODIMENTS

Figure 1:
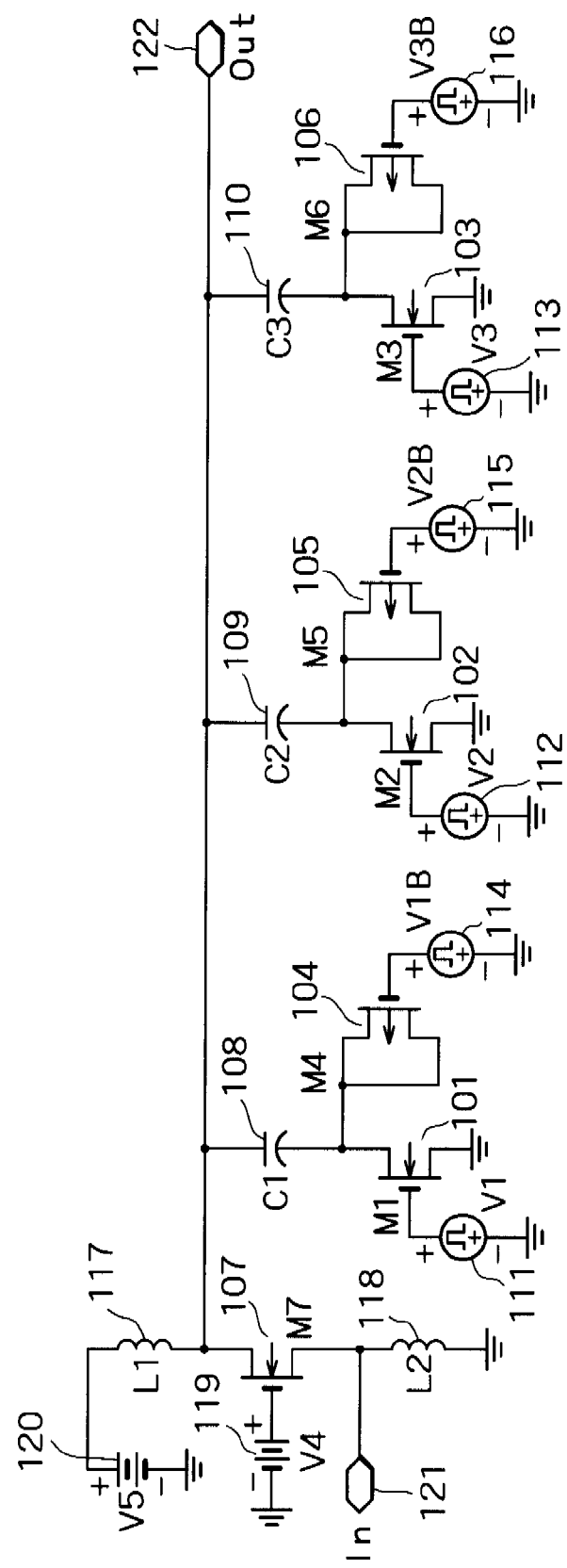
FIG. 1 is a circuit diagram of a high-frequency amplification circuit according to a first embodiment of the invention.

FIG. 1 is a circuit diagram showing the core portion of a high-frequency amplification circuit according to the first embodiment of the invention. A transistor (M7) 107 is a gate-grounded MOS transistor which constitutes a gate-grounded circuit. A bipolar transistor may be used as the transistor 107 with its base terminal grounded to thereby constitute a gate-grounded circuit. An input signal is input to the source terminal of the transistor 107 from an input terminal 121. An inductor (L2) 118 is connected between the source terminal of the transistor 107 and the ground in order to create the path of the DC bias current.

It is preferable that the inductor 118 should have its inductance value increased to such a level that the impedance with respect to an AC signal can be neglected. A wire-bonding inductance element can be used as the inductor 118. A bias voltage 119 connected to the gate of the transistor 107 determines the bias current that flows through the transistor 107. Preferably, the transistor 107 determines the bias current and drain voltage in such a way as to operate in a pentode area. To generate the bias voltage 119, a mirror circuit is of course constructed as generally done in an analog circuit.

The drain terminal of the transistor 107 is connected to an inductor 117 and a plurality of capacitors (C1 to C3) 108 to 110. The number of the capacitors is not limited to three but can take any arbitrary value. The inductor 117 and the capacitors serve as load having a band-pass characteristic. The other end of the inductor 117 is connected to a power supply (V5) 120 so that the bias current is supplied from the power supply (V5) 120 via the inductor 117. The Q value of the inductor 117 is represented by $\omega L/R$, and the greater the Q value is, the sharper the band-pass characteristic gets. An amplified signal is acquired from the drain terminal of the transistor 107.

The capacitors 108 to 110 are selected by transistors (M1 to M3) 101 to 103 and select signals 111 to 113. The transistors 101 to 103 may be MOSFETs or bipolar transistors as well. In any case, it is preferable that the transistors 101 to 103 should have low ON resistances and small parasitic capacitances. In case of using MOSFETS, N-type MOS transistors with low ON resistances are preferable.

The select signals 111 to 113 are pulse signals to turn the transistors 101 to 103 on or off. The transistors 101 to 103 have drain terminals respectively connected to the capacitors 108 to 110, gate terminals respectively connected to the select signals 111 to 113 and source terminals connected to the ground terminal. The Q value is also determined by the ON resistances of the transistors 101 to 103 and the capacitances of the capacitors 108 to 110, and is given by $1/\omega CR$. Even in this case, the greater the Q value is, the sharper the band-pass characteristic gets. As the selection of the capacitors 108 to 110 is changed arbitrarily, eight types of capacitances can be obtained, and eight types of resonance frequencies can be acquired which are determined by the inductor 117 and the capacitances.

Figure 24:
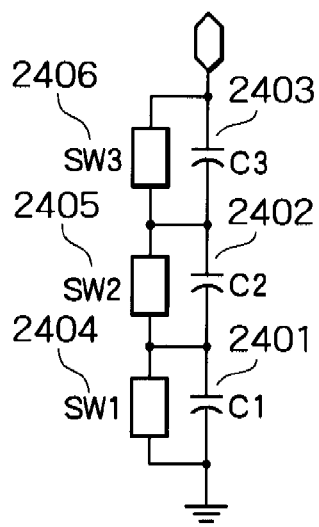
FIG. 24 is a diagram showing a variable capacitor circuit to be used in the invention.
Figure 25:
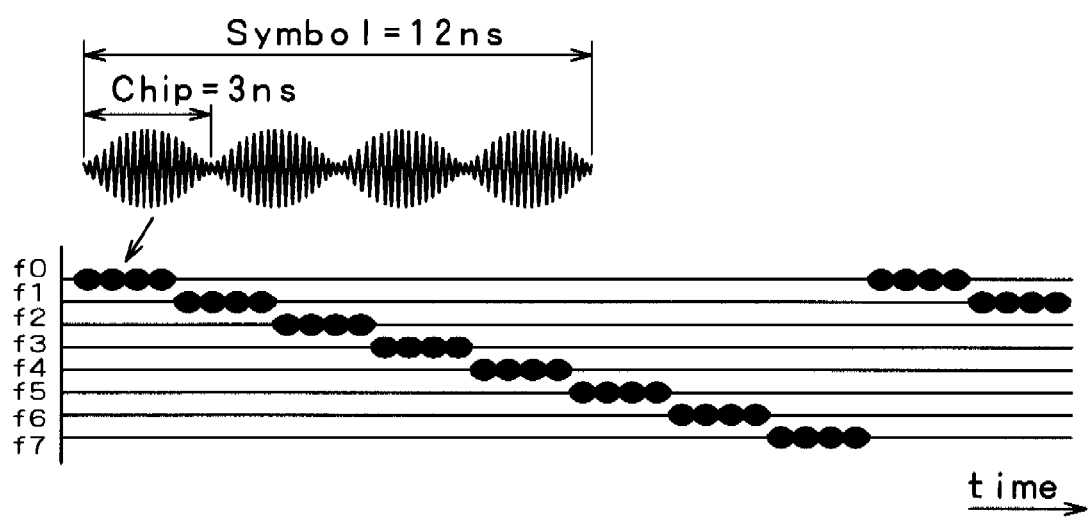
FIG. 25 is a timing chart for a UWB wireless system.
Figure 26:
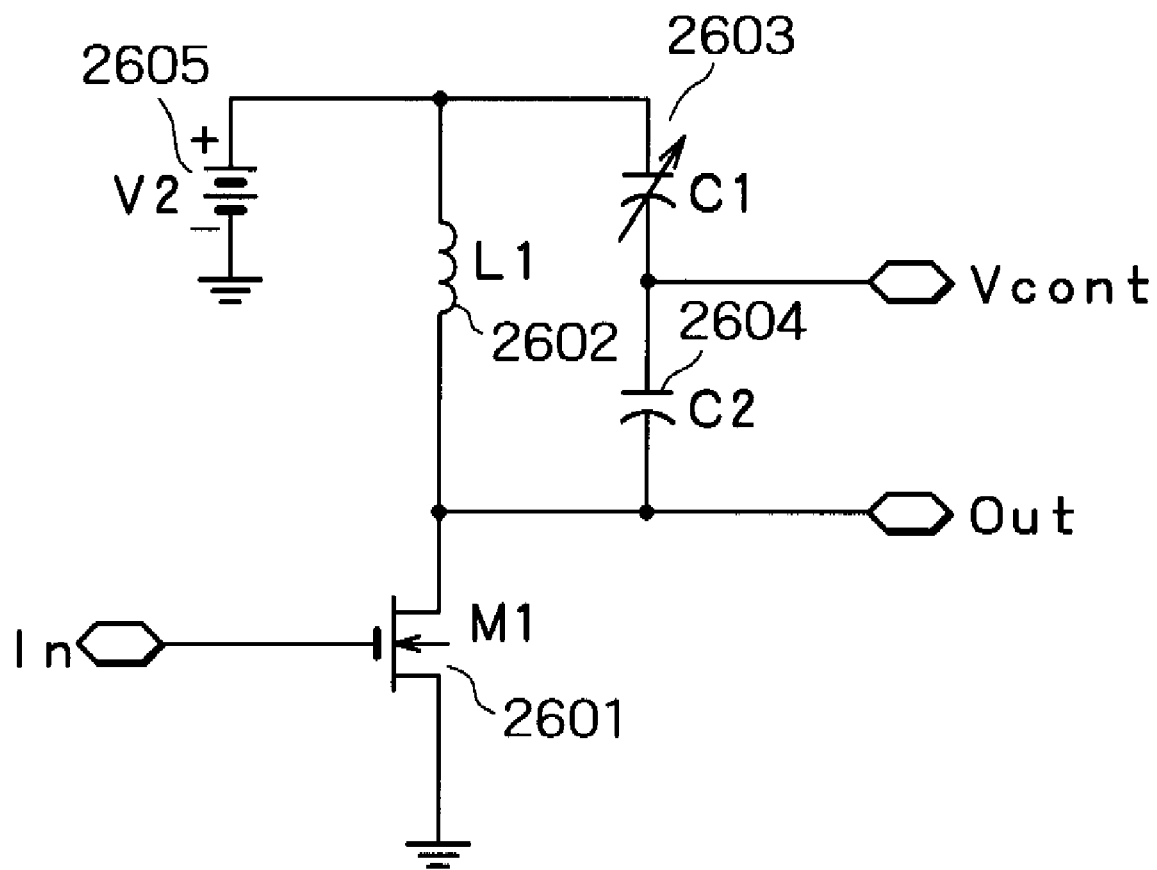
FIG. 26 is a diagram showing the effects of the invention.

In this example, a plurality of capacitors are connected in parallel and a switch is connected in series to each capacitor. As shown in FIG. 24, however, a plurality of capacitances can be acquired by connecting plural capacitors 2401 to 2403 in series to one another and connecting switches (SW1 to SW3) 2404 to 2406 in parallel to the capacitors 2401 to 2403 respectively.

An inductor intrinsically has an inductance so that another element which has an inductance can be used as well. Likewise, as a capacitor has a capacitance by nature, another element which has a capacitance can be used as well.

The pulse voltages of the select signals 111 to 113 to be applied to the gates of the transistors 101 to 103 cause ringing at the drain terminals of the transistors 101 to 103 and the drain terminal of the transistor 107 due to gate feed through. Transistors (M4 to M6) 104 to 106 and select signals 114 to 116 constitute a circuit which restrains the ringing and are connected to the transistors 101 to 103, respectively.

More specifically, it is preferable that the transistors 104 to 106 should have an opposite polarity to that of the transistors 101 to 103 (i.e., if transistors 101 to 103 are NMOS transistors, then the transistors 104 to 106 are PMOS transistors), should have the same channel length L as the channel length of the transistors 101 to 103 and should have a channel width W narrower than that of the transistors 101 to 103. The source terminal and the drain terminal of the transistor 104 are connected to the drain terminal of the transistor 101, and the gate terminal of the transistor 104 is connected to the select signal 114. Likewise, the transistors 105 and 106 are respectively connected to the transistors 102 and 103 in a similar manner.

The polarity of the select signals 114 to 116 is opposite to that of the select signals 111 to 113. When the select signals 111 rise, for example, the select signals 114 to 116 fall. It is preferable that the change start time and change end time of signal rising (or falling) of the select signal 111 should be as equal to those of the select signal 114 as possible. The same is true of the select signals 112 and 115, and the select signals 113 and 116.

The capacitances of the capacitors 108 to 110 may be set equal to each other or different from one another. In case of different capacitances, it is preferable to set the capacitances in such a way that the capacitances change in binary notation. With the capacitance of the capacitor 108 being C0, for example, the capacitance of the capacitor 109 is set to C0/2 and the capacitance of the capacitor 1110 is set to C0/4.

FIG. 2A is a block diagram showing a preferable embodiment including the core portion in FIG. 1 and what surrounds the core portion. An LAN core (1) 202 and an LAN core (2) 206 each represent the circuit in FIG. 1. The LAN core (1) 202 and LAN core (2) 206 have a differential structure which handles signals different from each other in phase by 180 degrees. The differential structure can further suppress ringing that occurs when the switching action takes place.

A signal from an antenna or so is input to Vin+ and Vin− terminals via a microstripe line or a CPW (Coplanar Waveguide) line. A matching circuit (1) 201 and a matching circuit (2) 205 match the characteristic impedances of those transmission lines. An example of such a matching circuit is disclosed in the publication, "Microwave Transistor" by Yoichiro Takayama, IEICE (pp 164 to 174 and 184 to 192).

The input impedance of the core portion in FIG. 1 takes a value given by approximately 1/gm7 (where gm7 is the mutual conductance of the transistor 107) because the circuit in FIG. 1 is a gate-grounded circuit. The characteristic impedance can be matched to an arbitrary impedance by adequately setting the mutual conductance gm, so that the matching circuit (1) 201 and the matching circuit (2) 205 can be omitted as needed. To match to the characteristic impedance of 50Ω, for example, gm7 should be set to approximately 20 mS.

Figure 16:
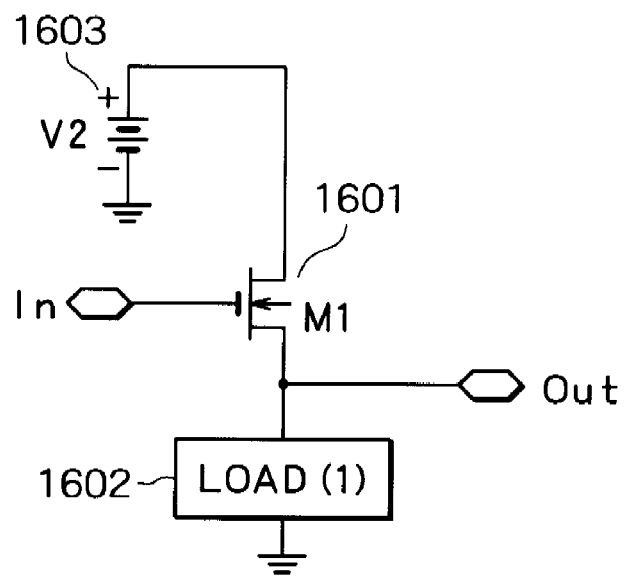
FIG. 16 is a diagram showing a source follower circuit to be used in the invention.

A buffer (1) 203 and buffer (2) 207 are circuit for ensure low capacitances that are needed at the output ends of the LAN core (1) 202 and the LAN core (2) 206. The buffer (1) 203 and the buffer (2) 207 are preferably source followers as shown in FIG. 16. The reason why low capacitances are needed at the output ends of the LAN core (1) 202 and the LAN core (2) 206 is to reduce the parasitic capacitance at the drain terminal of the transistor 107 that is present when the capacitors 108 to 110 are all turned off. Reducing the parasitic capacitance can bring up the resonance frequency to a high frequency.

Referring to FIG. 16, a transistor 1601 receives a signal at its gate terminal and outputs a signal from its source terminal. A resistor or a constant current source may be considered as a load (1) 1602 to be connected to the source terminal. As a source follower, which does not bring about a mirror effect, can reduce the input capacitance, it is suitable for such a purpose. The bias current that is needed for the buffer is determined mainly by the demanded noise level of the buffer. Because the gain of about 15 to 25 dB is obtained at the LAN core (1) 202 and the LAN core (2) 206 to thereby amplify the signal, the demanded noise level is relaxed, thus ensuring reduction in bias current.

A matching circuit (3) 204 and a matching circuit (4) 208 are used when matching is needed at the output line. Matching at the transfer line may be needed when the differential LNA is used at the final stage of a transmitter. As the output amplitude of a UWB transmitting device is small, particularly, such an LNA can be used as a PA (Power Amplifier).

FIG. 2B is a block diagram of a circuit used for a case where two differential LNAs in FIG. 2A are switched alternately from one to the other. After the resonance frequency is switched, a time of about 500 ps is needed to stabilize the amplitude. The circuit is adaptable to a system in which that time matters. A switch 213 switches an input signal and couples the differential input signal Vin+, Vin− to either a differential LNA (1) 211 or a differential LNA (2) 212 in response to the select signal. A switch 214 couples either one of differential output signals from the differential LNA (1) 211 and the differential LNA (2) 212 to an output terminal Vout+, Vout− in response to the select signal.

FIG. 2C shows a circuit designed for a purpose similar to the purpose of the circuit in FIG. 2B. In the circuit in FIG. 2C, the switch 213 on the input side in FIG. 2B is replaced with a (matching circuit+buffer) 217 and the select signal is input to a switch 218 on the output side. If matching is taken at the matching circuit portion, the input need not be switched. The buffer is used so that the characteristics of both the matching circuit and the differential LNA are not affected by the connection of those two elements.

FIG. 3A, like FIG. 2A, is a block diagram showing a preferable embodiment including the core portion in FIG. 1 and what surrounds the core portion. Unlike the circuit in FIG. 2A, the circuit in FIG. 3B handles single-ended signals. The switch can be used in a system where the influence of ringing is relatively permissible. A circuit in FIG. 3B, like the circuit in FIG. 2B, switches two LNAs alternately from one to the other. Like FIG. 2C, FIG. 3C shows a structure where the switch in FIG. 3B is replaced with a (matching circuit+buffer) 317.

FIG. 4 shows an example of a circuit which generates the select signals 111 and 114. A current mode logic (CML) of a differential structure is used in the example. It is preferable that the select signals 111 and 114 should operate at the same timing as mentioned earlier. In the example, a control circuit of a differential structure produces the timing needed for the select signals 111 and 114 from a reference clock, which is generated by a PLL (Phase-Locked Loop) or so of a differential structure, such as a CML. The CML includes transistors 401 and 402, a load (1) 404, a load (2) 405 and a current source 403. A resistor, an inductor or a transistor can be used as the load (1) 404 and the load (2) 405. Inverters 406 and 407 are used to convert the fluctuation of the CML level to a CMOS level.

FIG. 5 is a timing chart illustrating the operation of the high-frequency amplification circuit according to the invention. According to the timing chart, the high-frequency amplification circuit operates in such a way as to be able to cope with the aforementioned multi-band system. f0 to f7 indicate a signal voltage coming from the antenna, separated frequency by frequency. The frequencies f0 to f7 repeat hopping in such a way that after a signal of the frequency f0 arrives, for example, the frequency f0 is hopped to the frequency f1, then to the frequency f2 and so forth to the frequency f7, then returns to the initial frequency f0. Each signal has a waveform which includes four sets of frequencies, each of which may take a form as given at, for example, time t0. The occupied frequency band of each signal is determined by the time t0. When t0 is 3 ns or so, for example, the occupied frequency band BW of each signal becomes 500 MHz or so. Eight frequency signals cover the frequency of about 4 GHz.

V1 to V3 and V1B to V3B in FIG. 5 show timings of the pulse voltage that has been explained referring to FIG. 1. In the example, when a signal of the frequency f0 is input, V1 to V3 are set to high levels to connect the capacitors 108 to 110 as loads. That is, all of the transistors 101 to 103 are turned on. As the resonance frequency that is determined by the combined capacitance of the capacitors 108 to 110 and the inductance of the inductor 117 is set near f0, the LNA in FIG. 1 can amplify the input signal f0 with a high gain and can attenuate the other frequencies according to the characteristic of the LC circuit.

The timings in FIG. 5 are given on the premise that the values of the capacitances of the capacitors 108 to 110 are weighted in a binary form, so that a total of eight kinds of frequencies can be resonated sequentially by changing the high or low levels of the timings V1 to V3. The resonance frequency f is given from the capacitance C that is determined by the parasitic capacitance provided by the capacitors 108 to 110 and the inductance L of the inductor 117 by using the following equation.

$$f = 1/(2\pi\sqrt{LC})$$

It is apparent from the equation that even when the capacitance C is linearly changed by selecting the capacitors 108 to 110, the frequency f does not change linearly. When the frequencies f0 to f7 are so designed as to linearly change by a given frequency, there may be a case where the linear change cannot be coped with accurately merely by the selection of the capacitors 108 to 110. The frequency can be set to an arbitrary frequency by further increasing the number of binary capacitances. Further, if the Q value of the LC circuit is set to a relatively low value, the band-pass characteristic that is determined by LC circuit becomes relatively broad. That is, the amplification of the input signal can be done with a high gain without accurately matching the resonance frequency with the frequency of the input signal.

Synchronization of hopping of the input signal and hopping of the resonance frequency can be accomplished by setting the following specifications as defined in the communication standards.

For example, with the frequency f0 in FIG. 5 determined as a beacon, the frequency f0 is used as a standby frequency before synchronization is established. When synchronization of PLLs and reference frequencies of both the reception side and transmission side are established by communication at the frequency f0, hopping is initiated. A hopping pattern may be determined beforehand or in communication with the beacon. Hopping can bring about the frequency diversity effect as well as an effect of ensuring multi-access with different hopping patterns and an effect of enhancing the multi-pass duration.

V1B to V3B in FIG. 5 have the opposite polarity to the polarity of V1 to V3. When V1 goes to high from the low state, for example, V1B goes to low from the high state. This can restrain occurrence of ringing caused by feed through of the pulse voltage.

Figure 6A:
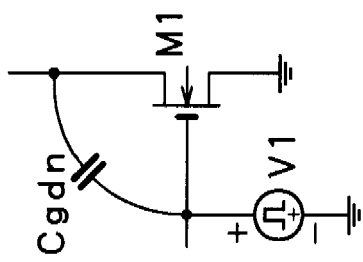
FIGS. 6A to 6C show operational waveforms of the high-frequency amplification circuit according to the first embodiment of the invention.
Figure 6C:
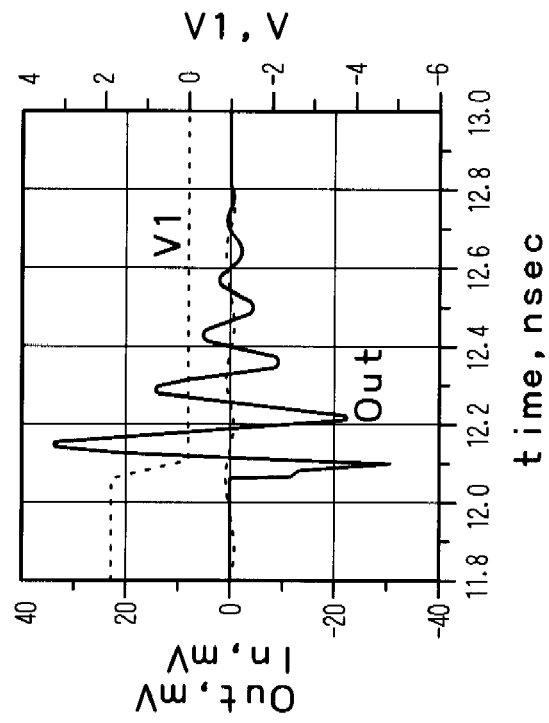
Figure 6B:
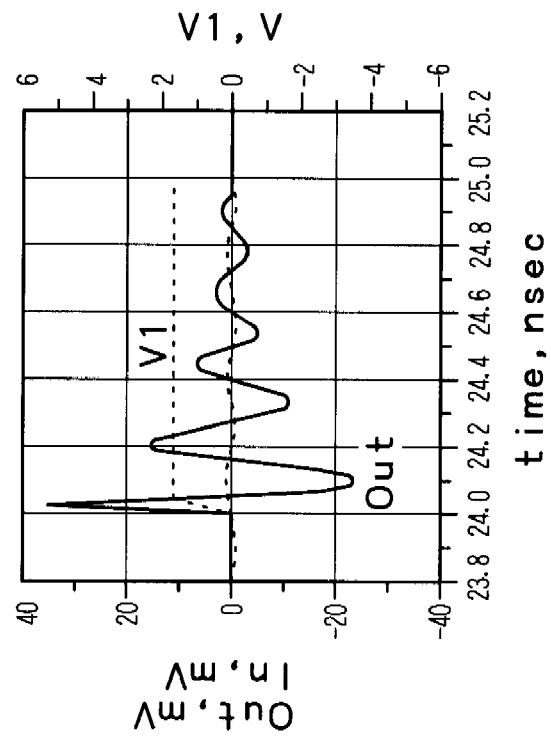

FIGS. 6A to 6C show how ringing occurs when the transistors 104 to 106 are not present. A parasitic capacitor Cgdn is present between the drain and gate of a transistor M1 (the transistor 101 in FIG. 1) in FIG. 6A. At the rising of the pulse V1 to be applied to the gate terminal of the transistor M1, the pulse V1 appears at the drain terminal via the parasitic capacitor Cgdn. The amplitude at the drain terminal is divided by both the capacitor 108 connected to the drain terminal and the parasitic capacitor Cgdn, and thus becomes considerably smaller than the amplitude of the pulse V1 itself, but large ringing like a signal Out in FIG. 6B appears at an output terminal Out122 in FIG. 1. The amplitude of the ringing, which is determined by the amplitude of the pulse V1, the capacitance of the parasitic capacitor Cgdn and the capacitance of the capacitor C1, reaches several tens of millivolts in this case. Similar ringing also occurs at the falling of the pulse V1 as shown in FIG. 6B.

Figure 7A:
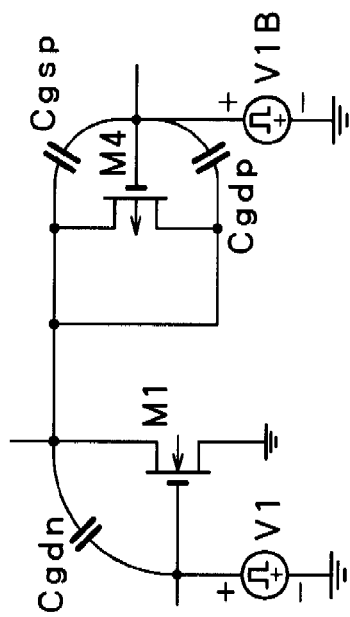
FIGS. 7A to 7C show operational waveforms of the high-frequency amplification circuit according to the first embodiment of the invention.
Figure 7C:
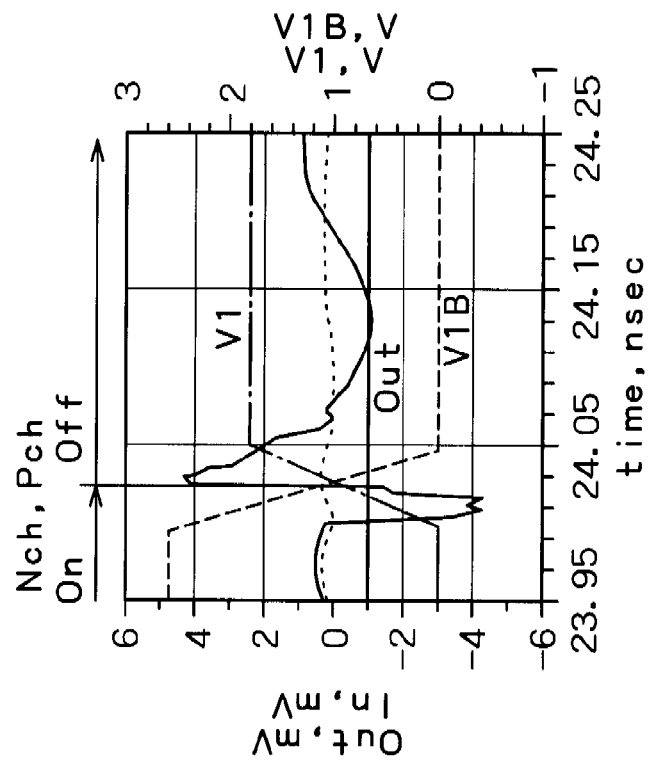
Figure 7B:
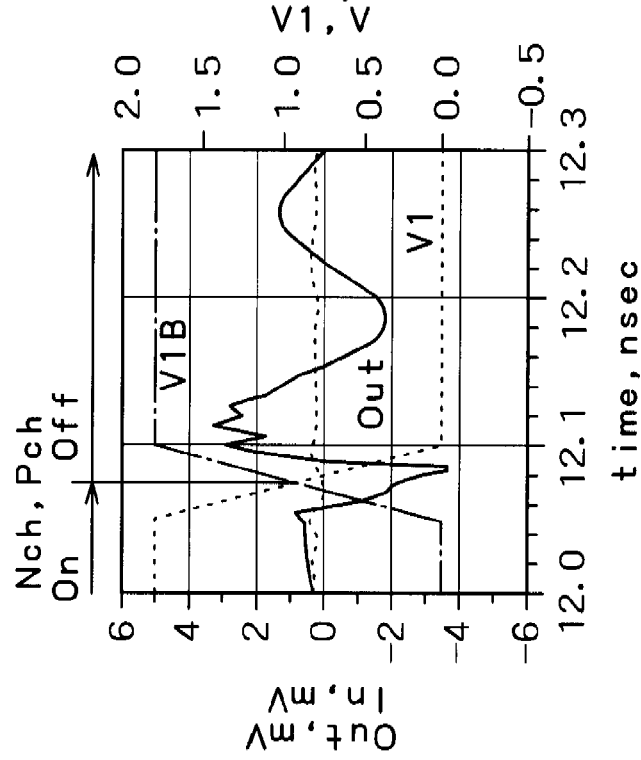

FIGS. 7A to 7C show how to restrain ringing when there are the transistors 104 to 106 in FIG. 1. As shown in FIG. 7A, a parasitic capacitor Cgdp is present between the drain and gate of a transistor M4 (the transistor 104 in FIG. 1) and a parasitic capacitor Cgsp is present between the source and gate of the input signal M4. By adequately selecting the gate width W of the transistor M4, feed through to the drain terminal of the transistor M1 by the pulse voltage V1 can be suppressed. Specifically, the amount of charges that are drained from the drain terminal is determined by the pulse voltage V1 and the parasitic capacitor Cgdn. This amount of charges should be matched with the amount of injected charges which is determined by the combined capacitance of the parasitic capacitors Cgdp and Cgsp and the amplitude of the pulse voltage V1B.

FIG. 7B shows how to restrain ringing at the output terminal Out at the rising of the pulse V1. As the pulse V1 rises, charges are injected into the drain terminal of the transistor M1 through the parasitic capacitor Cgdn. At the same time, the voltage V1B falls, thereby draining charges from the drain terminal through the combined capacitance. Because the amount of charges to be injected and the amount of charges to be drained are nearly matched with each other, a fluctuation in the amount of charges at the drain terminal can be suppressed, so that the occurrence of ringing at the output terminal Out can be suppressed.

Based on the principle, it is preferable to match the time at which rising of the pulse V1 starts, the absolute value of dV/dt (time differential of the voltage) during a change in voltage, the time at which pulse rising ends and becomes stable with the time at which falling of the pulse V1B starts, the absolute value of dV/dt, the time at which pulse falling ends, respectively.

It is also preferable that the transistors M1 and M4 (transistors 101 and 104) should have opposite polarities. That is, it is preferable that when the transistor M1 is of an NMOS type, the transistor M4 should be of a PMOS type. This is because when the pulse V1 rises, the transition of the transistor M1 from the OFF state to the ON state should be matched with the state change of the transistor M4. That is, as the pulse voltage V1B falls, the PMOS type transistor M4 goes to the ON state from the OFF state. Because the mobility (injection or draining) of charges changes depending on the ON or OFF state of the transistor, such a phenomenon occurs.

With the use of the transistors M1 and M4 which have the same polarity, in the voltage transition, the transistor M4 is turned on when the transistor M1 is off and the transistor M1 is turned off when the transistor M4 is off. In this case, the transistor which is on has a greater parasitic capacitance, increasing the mobility of charges, so that, for example, the positive charges are injected at the first half of the voltage transition and the negative charges are injected at the second half of the voltage transition.

FIG. 7C shows how to restrain ringing at the output terminal Out at the falling of the pulse voltage V1 and the rising of the pulse voltage V1B. In this case, the amount of charges to be drained by the transistor M1 and the amount of charges to be injected by the transistor M4 become approximately the same too, thereby suppressing the occurrence of ringing at the output terminal Out.

As the drain terminal and source terminal of the transistor M4 are connected together, the product L·W of the channel length L and the channel width W of the transistor M4 has the optimal value around ½ of the product L·W of the channel length L and the channel width W of the transistor M1 but values around ½ of the latter product L·W can be used. The value of the former product L·W, if set smaller than "1", provides a preferable result.

As mentioned earlier, it is desirable that the ON resistance of the transistor M1 (transistor 101) which enables or disables the capacitor 108 should be low and the transistor M1 should be of an NMOS type. In this case, the capacitor is connected to the ground when the transistor M1 is on. As the inductor 117 is connected to the power supply 120, it is preferable to connect a decoupling capacitor, which bypasses a high-frequency signal, between the ground and the power supply.

Ringing at the output terminal Out is suppressed to several millivolts in the above-described manner as shown in FIGS. 7B and 7C.

This ringing is further suppressed to 1/10 by the differential structure shown in FIG. 2.

Figure 8A:
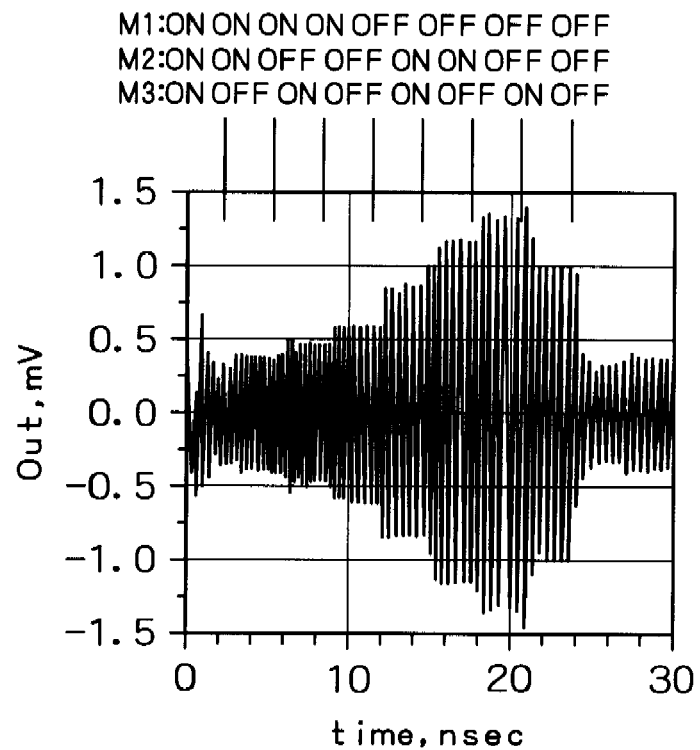
FIGS. 8A and 8B show operational waveforms of the high-frequency amplification circuit according to the first embodiment of the invention.
Figure 8B:
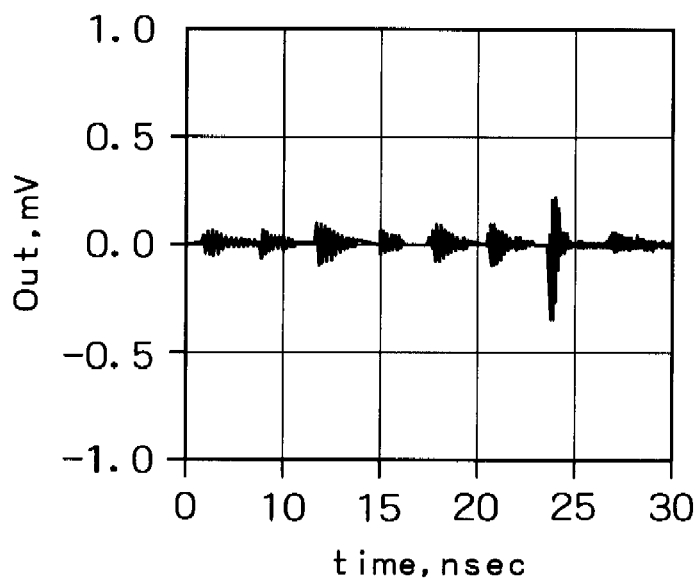

FIG. 8B shows operational waveforms with no signal at the output terminal Out at the time individual switching actions take place in the differential structure (FIG. 2A) employed. While ringing slightly occurs, it is suppressed to a fluctuation of 100 μV or less.

FIG. 8A shows operational waveforms at the output terminal Out when a signal of −70 dBm is applied to the input of the LNA. As shown in FIG. 5, hopping takes place sequentially over f0 to f7, and the switch setting of the LNA is done so as to obtain the resonance frequency at around f6. The maximum amplitude is acquired at around f6 and for the other frequencies, the amplitude becomes lower as the frequencies go away from f6, thereby providing the band-pass characteristic.

As shown in FIG. 8A, it takes time of 500 ps or so at a maximum for the amplitude to become stable after selection of the transistors M1 to M3 (transistors 101 to 103) is changed. This is because it is very difficult for an LNA, which has a finite upper frequency, to raise the amplitude spontaneously. It is to be noted however that in the UWB, a window function, such as cosine, is applied to one signal group at time t0, as shown in FIG. 5, so that the amplitude need not rise spontaneously. When the time till stabilization or slight ringing remaining as in FIG. 8B matters, it is possible to employ a structure which switches two LNAs from one to the other as shown in FIG. 2B or FIG. 2C.

Figure 9A:
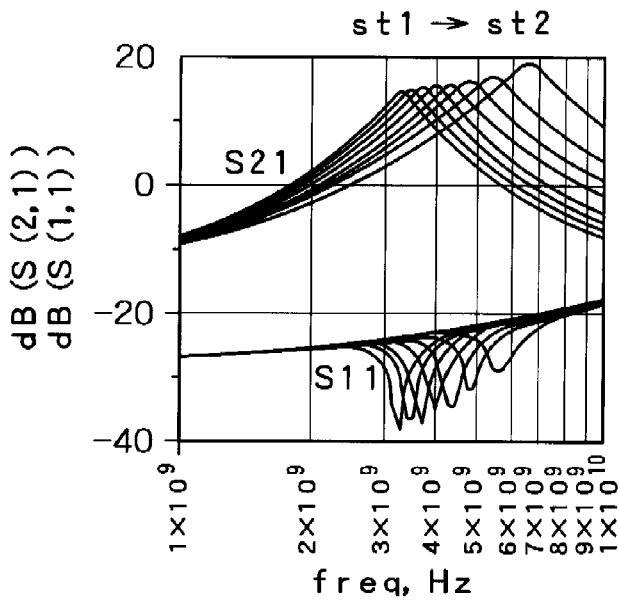
FIGS. 9A to 9C show characteristics of the high-frequency amplification circuit according to the first embodiment of the invention.

FIG. 9A shows the gain characteristic, S21, and the reflection characteristic, S11, of the LNA. The frequency is plotted for all the cases where eight types of ON and OFF states of transistors 101 to 103 are changed sequentially. For example, st1 indicates in a case where the transistors 101 to 103 are all set on and the capacitors 108 to 110 are all connected as loads to maximize the combined capacitance. The resonance frequency becomes 3.5 GHz or so at which the gain obtained is as high as about 15 dB. The frequency characteristic of the gain has a band-pass characteristic, has a peak at the resonance frequency, and attenuates as it goes away from the resonance frequency.

Paying attention to st1, the reflection characteristic has a peak of −38 dB or so at around 3.5 GHz, and rises as it goes away from the peak value. The rise does not go beyond around −20 dB. This is because the input matching is basically set to, for example, 50Ω by 1/gm, and only the peak characteristic appears as the impedance at the drain terminal changes.

Likewise, st1 to st8 control the ON/OFF actions of the transistors 101 to 103 and the selection of the capacitors 108 to 110 to sequentially reduce the combined capacitance. The center frequency of the band-pass characteristic is shifted sequentially toward the high-frequency side so that the entire band-pass characteristic is shifted toward the high-frequency side. At st8, the resonance frequency (center frequency) of 7 GHz and the peak gain of 19 dB or so are obtained.

The feature of the invention lies in that the shifting of the center frequency of st1 to st8 can be done in a short period of time of about 10 ns.

The Smith chart of the reflection characteristics S11 has st1 to st8 plotted over a frequency range of 1 to 10 GHz and nearly matches with the characteristic impedance (50Ω in this case). When the transistor 107 in use has undergone a 0.18 μm process, is of an NMOS type and has sizes of W/L=63 μm/0.18 μm and the bias current of 1.4 mA or so is let to flow, 1/gm becomes about 50Ω, thereby ensuring such matching.

Figure 9B:
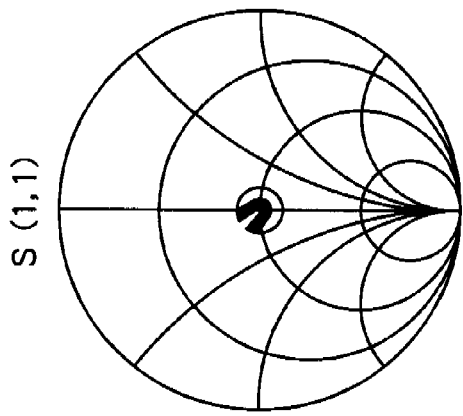
Figure 9C:
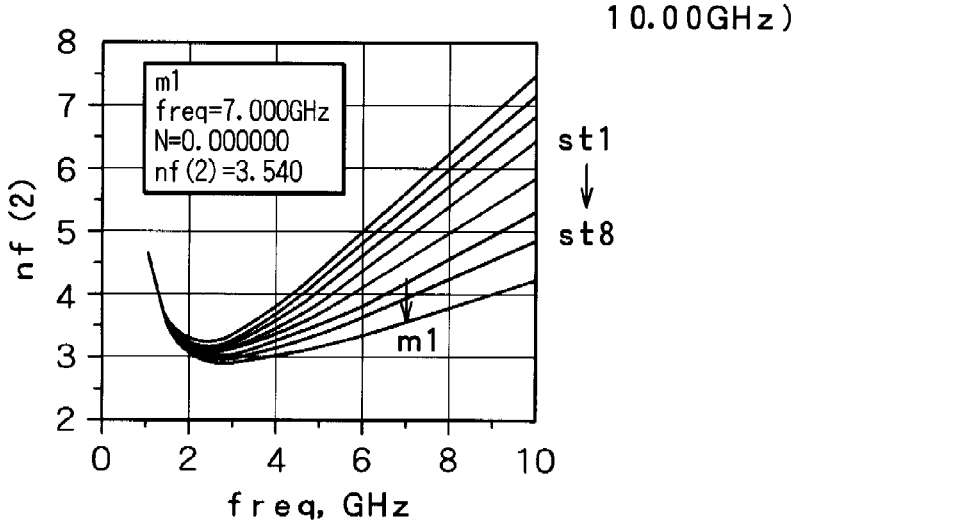

FIG. 9C shows a noise factor (NF) plotted with respect to st1 to st8. At any setting, the NF is a minimum at around 3 to 4 GHz and rises as it moves away from that frequency. The closer to the setting of st8, the gentler the rise on the high-frequency side becomes. In case of amplifying the input signal of 3.5 GHz or so, the gain peak at 3.5 GHz appears at the setting of st1, so that it is preferable to make the setting of st1. At this time, it is apparent from the curve of st1 that the NF takes a value of about 3.5 at 3.5 GHz. To amplify the input signal of 7 GHz or so, likewise, it is preferable to make the setting of st8 due to the gain characteristic in which case it is apparent from the curve of st8 that the NF takes a value of about 3.5.

The effects of the invention are mainly classified into the following five effects.

The first effect is that the gain characteristic has a band-pass characteristic so that the gain of the desired frequency can be increased while the gains of the other frequencies can be reduced. What is more, the resonance frequency (center frequency) can be changed fast. This effect leads to a desirable result for the LNA for UWB communication which hops the frequency fast as shown in FIG. 5 to cover a wide band.

In other words, at the desired frequency, a high gain of at least 15 dB is achieved so that the influence of noise generated by a subsequent circuit (e.g., a mixer) or so does not become noticeable. While the band of each frequency (sub-band) in FIG. 5 is around 500 MHz in UWB communication, a gain of 15 dB or greater can be obtained even in this band by the gentle band-pass characteristic in FIG. 9A. It is therefore preferable that the Q value of the resonance circuit (load) should be selected to be 5 to 15 or so. This value is easily achieved by the ordinary LSI process.

Figure 23:
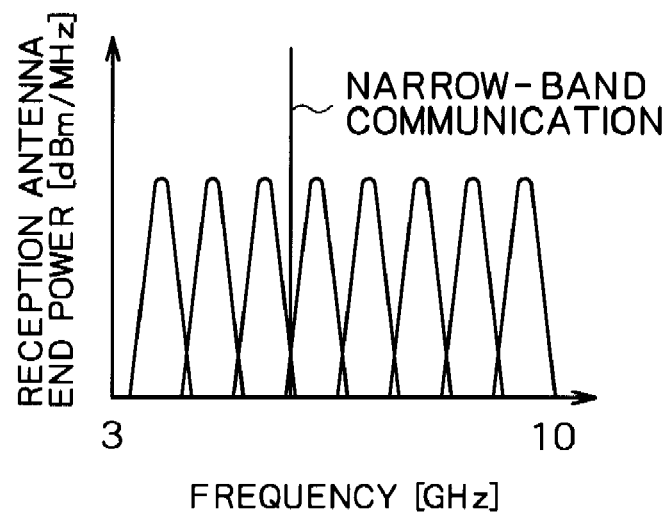
FIG. 23 is a diagram showing the effects of the invention.

Further, non-interference from other communications or interference to other communications can be suppressed. The other communications include an interference between terminals in the same UWB communication and an interference between Piconets. At the setting of st1 in FIG. 9A, for example, signals of 3.5 GHz in UWB communication are amplified, in which case narrow-band communication like wireless LAN of 5 GHz (IEEE. 802.11a standards or the like) becomes a strong interference-susceptible source. This is illustrated in FIG. 23. A narrow-band signal is superimposed on a signal of 3.5 GHz, lowering the bit error rate (BER) characteristic in UWB communication or impairing the link budget (the table of the gains and attenuation amounts at the individual portions of the lines between the sender and receiver). Furthermore, the signal of 5 GHz occupies the dynamic range of the LNA, thus disabling (blocking) the use of the LNA.

At the setting of st1 in FIG. 9A, the gain at 5 GHz is attenuated by 10 dB or so with respect to the gain at 3.5 GHz, thus providing a margin of about 10 dB with respect to the BER, link budget and blocking. This margin can be changed by optimizing the Q value, the number of filters and the types of filters according to the specifications of the UWB communication.

At the same time, the noise band can be narrowed, making it possible to suppress noise coming from the signal source, noise from the transistor M1, noise caused by the resistance component of the inductor in use.

At the setting of st1 in FIG. 9A, for example, the frequency range that attenuates from the peak gain by 3 dB is around 1 GHz. This means that the noise band is as narrow as 1 GHz or so, so that power is suppressed by 1/7, i.e., noise is suppressed by −8 dB or so with respect to simple amplification of a signal of, for example, 7 GHz in the frequency range of 3 to 10 GHz. The BER and link budget can be improved further by that attenuation.

Likewise, when the LNA is used on the transmission side, it is possible to amplify the desired frequency and suppress transmission of an undesirable component, such as a spurious, thereby restraining interference to other communications.

The second effect is that the reflection characteristic can be reduced over a wide band. Such a narrow-band is difficult to achieve in a matching circuit of a π type, T type or the like which uses a conventional inductor or a matching circuit which has an inductor connected to the source of a transistor.

The third effect is that an NF can be set to a low value of 3 or so. A low NF of 3 or so is acquired over a wide frequency range by controlling the ON/OFF actions of the transistors M1 to M3 (selection of the capacitors C1 to C3), and is a sufficient characteristic in UWB communication or the like. There is some narrow-band LNA which obtains a lower NF, which is achieved by the narrow-band matching circuit or a load so that the LNA cannot be adapted to a wider band. Susceptibility to interference and multi-path oriented deterioration of the link budget are dominant in UWB so that an NF of 3 or so is sufficient.

The fourth effect is that such a high gain and low NF can be achieved by a small circuit area. As discussed in the DESCRIPTION OF THE RELATED ART, it is difficult to realize a high gain and low NF over a wide band with a small circuit area.

It is an inductor in the circuit of the invention which needs a large area. However, the inductor 118 can be replaced with the inductance of a bonding wire in which case only the inductor 117 is used in the high-frequency amplification circuit. Of course, the inductor 117 can also be replaced with the inductance of a bonding wire. This ensures an LNA of the level of several micron meters to several tens of micron meters.

The fifth effect is that such an excellent characteristic can be acquired with low power consumption of 5 mW or so. In this case, the supply voltage is 1.8 V or so, and the bias current is 1.4 mA or so. UWB is used in portable devices and demands as lower power consumption as possible.

Figure 10A:
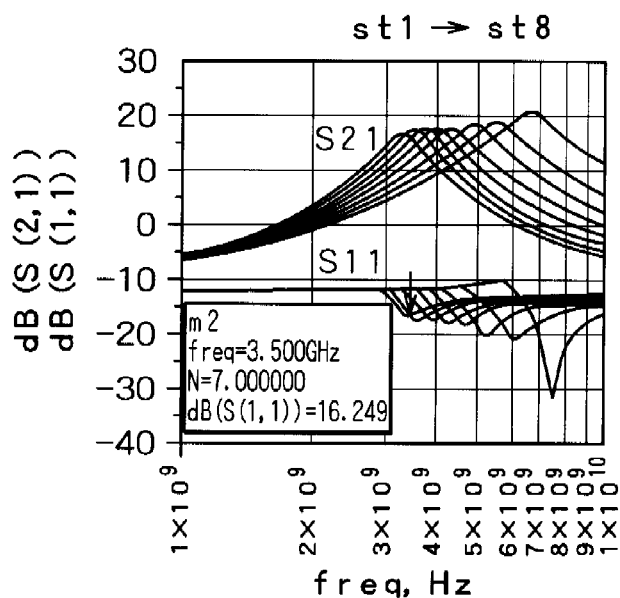
FIGS. 10A to 10C show characteristics of the high-frequency amplification circuit according to the first embodiment of the invention.
Figure 10B:
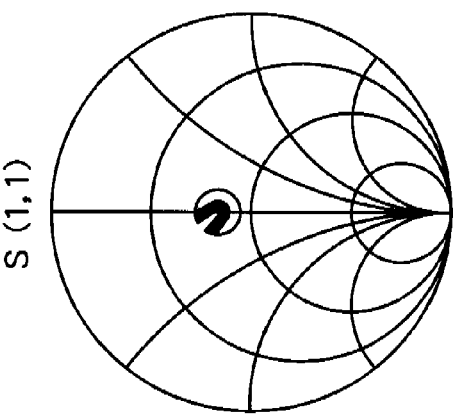
Figure 10C:
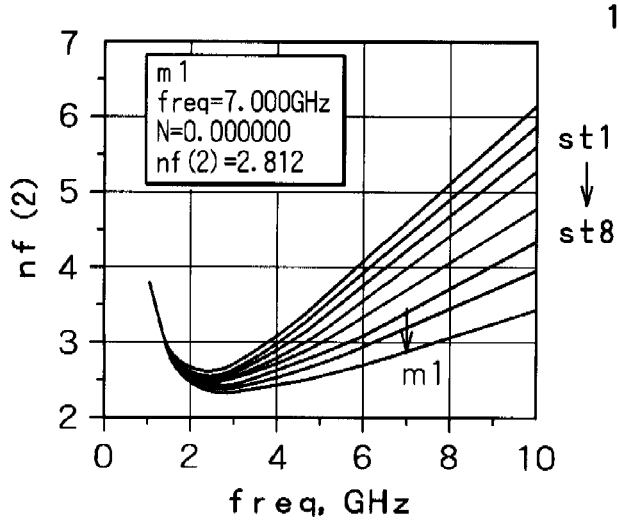

FIGS. 10A to 10C show characteristics of the high-frequency amplification circuit with the same circuit structure as that of the circuit in FIGS. 9A to 9C, but in case where the drain bias current of the transistor 107 is increased to 2.3 mA. The increased current increases the mutual conductance gm, which increases the gain, thus lowering the NF. The gain is increased because the gain is given by the mutual conductance gm×the load impedance. The NF is decreased because the noise that is generated in the transistor 107 is given by 8 kT/(3 gm) where k is the Boltzmann constant and T is the Kelvin temperature. The increase in the mutual conductance gm shifts up the reflection characteristics S11 to −10 dB or so, which does not matter so much. The power consumption is around 4 mW. The gain becomes 18 to 22 dB. The NF is 2.8 or so.

The merit of this embodiment is the improvements on the gain, the NF and the linearity (IP3). Although the power consumption slightly increases, the embodiment can be used in a system which has a sufficient margin for power consumption. The case in FIGS. 9A to 9C and the case in FIGS. 10A to 10C can be switched from one to the other by means of a switch or so. This can be achieved by switching the drain current by switching the gate voltage of the transistor 107. When a high gain or a low NF becomes necessary as in a case where, for example, the channel (space) conditions are changed, the state can be switched to the state shown in FIGS. 10A to 10C.

Figure 11A:
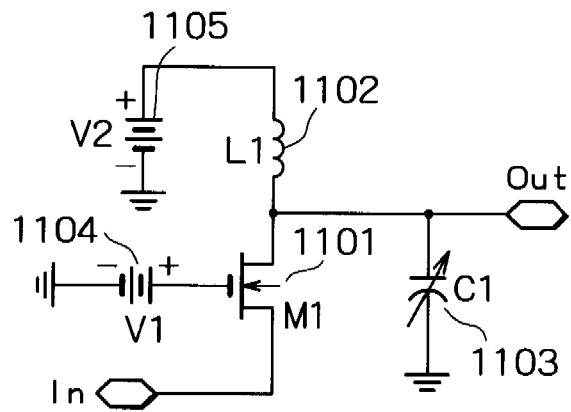
FIGS. 11A to 11C are circuit diagrams of a high-frequency amplification circuit according to a second embodiment of the invention.
Figure 11B:
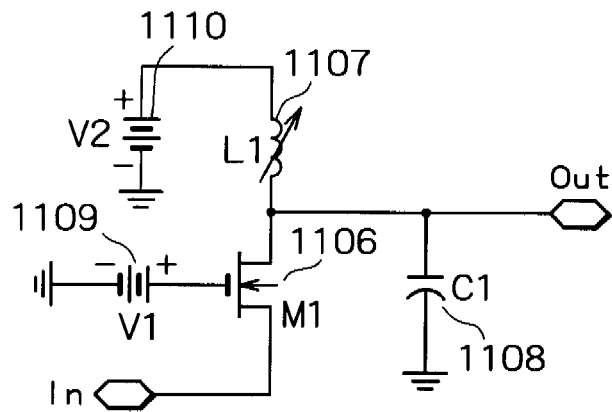
Figure 11C:
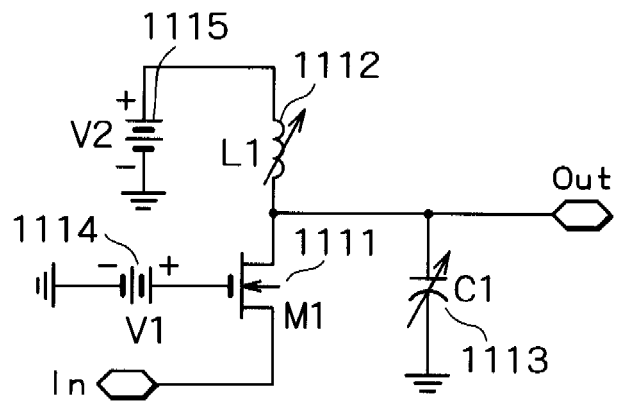

FIGS. 11A to 11C are circuit diagrams of another embodiment of the invention. The subject matter of the invention is to amplify signals over a wide band by hopping the resonance frequency (the center frequency of the filter characteristic) and to attenuate spurious signals. Based on the subject matter, the structures as shown in FIGS. 11A to 11C are feasible.

FIG. 11A is similar to FIG. 1 in concept, and shows the structure that has a variable capacitor (C1) 1103 in place of the capacitors 108 to 110 in FIG. 1, whereby the resonance frequency is hopped fast by changing the capacitance of the variable capacitor 1103. The structures of a transistor 1101 and the portion around the transistor are the same as those of the transistor 107 and the portion around the transistor 107 in FIG. 1, except that there is no element corresponding to the inductor 118 in FIG. 1. The capacitance of the variable capacitor 1103 is changed by a scheme of using a varactor and changing the DC voltage to be applied to the varactor, besides the scheme of switching plural capacitance elements by means of a switch as illustrated in FIG. 1. Further, a structure which includes a transistor having a voltage gain Av and an element with a capacitance C connected to the transistor may be used to provide a capacitance of Av×C equivalently. In this case, the equivalent capacitance of Av×C may be varied by changing the voltage gain Av by changing the bias current or so.

Figure 17:
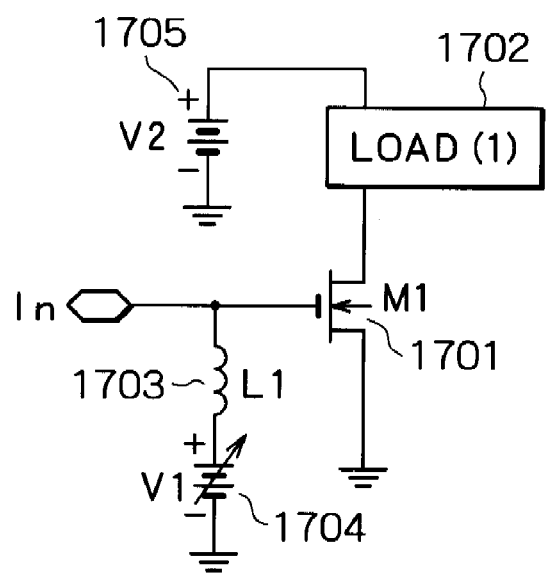
FIG. 17 is a diagram showing a variable capacitor circuit to be used in the invention.

FIG. 17 shows such a structure which uses the voltage gain Av of a transistor (M1) 1701 and the gate-drain capacitance Cgd. In this structure, the input capacitance as seen from the gate (terminal In) is expressed by Av×Cgd and can be changed by varying the voltage gain Av. The voltage gain Av is given by Av=gm×Z which is the product of the mutual conductance gm of a transistor 1701 and the impedance, Z, of a load 1702. The voltage gain Av can be changed by changing the mutual conductance gm by varying, for example, the bias voltage V1 applied to the gate terminal of the transistor 1701, thereby changing the drain current. An inductor 1703 is used to insulate the terminal In and a V1 power supply 1704 in an AC fashion. Reference symbol "1705" denotes a V1 power supply.

Although one end of the variable capacitor 1103 in FIG. 11A is connected to the ground, it can be connected to a VDD power supply. It is however often preferable to provide the variable capacitor 1103 close to the ground side because such provision can allow a low-resistance NMOS to be used, which brings about an effect of reducing the Q value. To permit control of the frequency by a variable capacitor over a wide band, the parasitic capacitance should be made smaller. Reducing the parasitic capacitance requires that the size or so of the transistor should be made smaller, which however would increase the ON resistance of the transistor. An NMOS type transistor is therefore preferable to improve this trade-off situation.

FIG. 11B shows the structure that has a variable inductor 1107 in place of the inductor 117 to hop the resonance frequency quickly. A variable capacitor (C1) 1108 is provided in place of the capacitors 108 to 110 in FIG. 1. The structures of the transistor 1101 and the portion around the transistor are the same as those of the transistor 107 and the portion around the transistor 107 in FIG. 1, except that there is no element corresponding to the inductor 118 in FIG. 1. Some examples of the structure of the variable inductor 1107 are illustrated in FIGS. 18A to 18C.

Figure 18A:
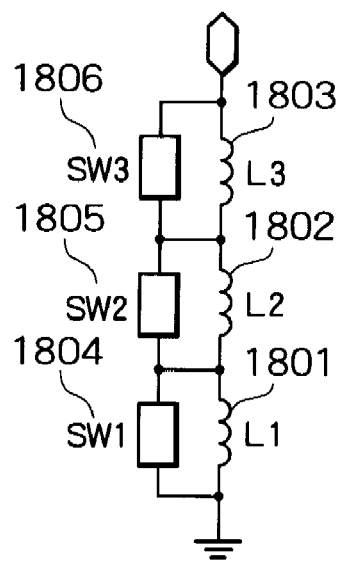
FIGS. 18A to 18D are diagrams showing variable inductor circuits to be used in the invention.

FIG. 18A shows the structure where inductors 1801 to 1803 are connected in series and switches 1804 to 1806 are connected to the associated inductors in parallel. The use of three inductors whose inductances are different in a binary fashion for the inductors 1801 to 1803 can provide a total of eight inductances.

Figure 18B:
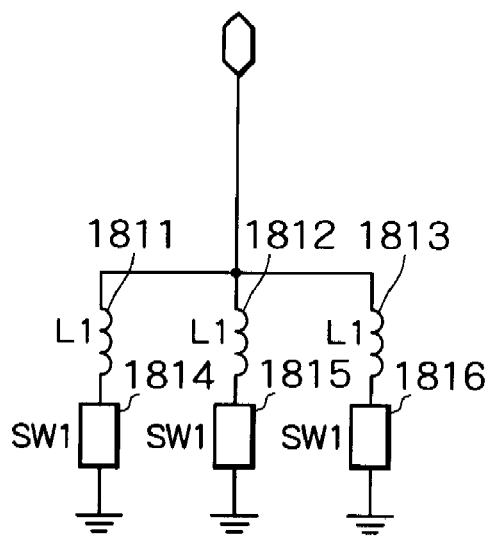

The structure in FIG. 18B has three inductors with different inductances connected in parallel to one another. Switches 1814 to 1816 are connected to in series to the associated inductors and whether the individual inductors are to be selected or set floating is determined by the actions of the switches. In this case, three kinds of inductances can be acquired by selecting one of the three inductors.

Figure 18C:
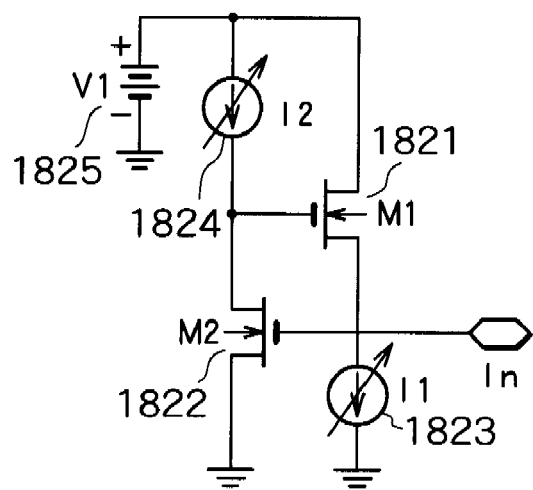

FIG. 18C shows an example where an active inductor is used as a variable inductor. The source terminal of a transistor 1821 is connected to the gate terminal of a transistor 1822 and is connected to a current source 1823 and an input terminal In. The gate terminal of the transistor 1821 is connected to the drain terminal of the transistor 1822 and is further connected to a current source 1824. With the connection, an equivalent circuit as seen from the input terminal In is depicted as shown in FIG. 18D.

Figure 18D:
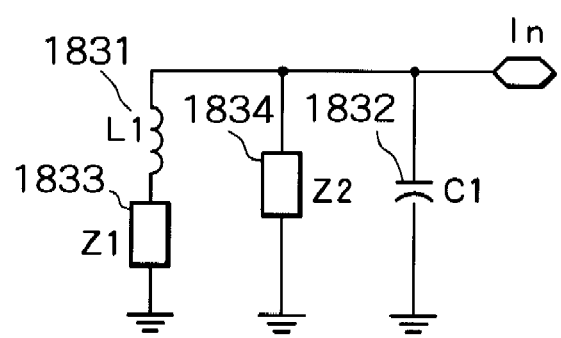

Referring to FIG. 18D, the inductance of an inductor 1831 is given by Cgs1/(gm1·gm2) where Cgs1 is the gate-source capacitance of the transistor 1821 and gm1 and gm2 are mutual conductances of the transistors 182 and 1822, respective. The inductor of the inductor 1831 can be varied by changing gm1 or gm2.

FIG. 11C shows an example which is the combination of the circuits in FIG. 11A and FIG. 11B and uses a variable capacitor as a capacitor 1113 and a variable inductor as an inductor 1112. Of course, those explained above referring to FIGS. 11A and 11B can be used as the variable capacitor and the variable inductor. The other elements, given different reference symbols though, are the same as corresponding elements in FIG. 11A or FIG. 11B. Given that m is the number of types of capacitances that can be provided by the variable capacitor and n is the number of types of inductances that can be provided by the variable inductor, a total of m×n types of resonance frequencies can be provided.

Figure 12A:
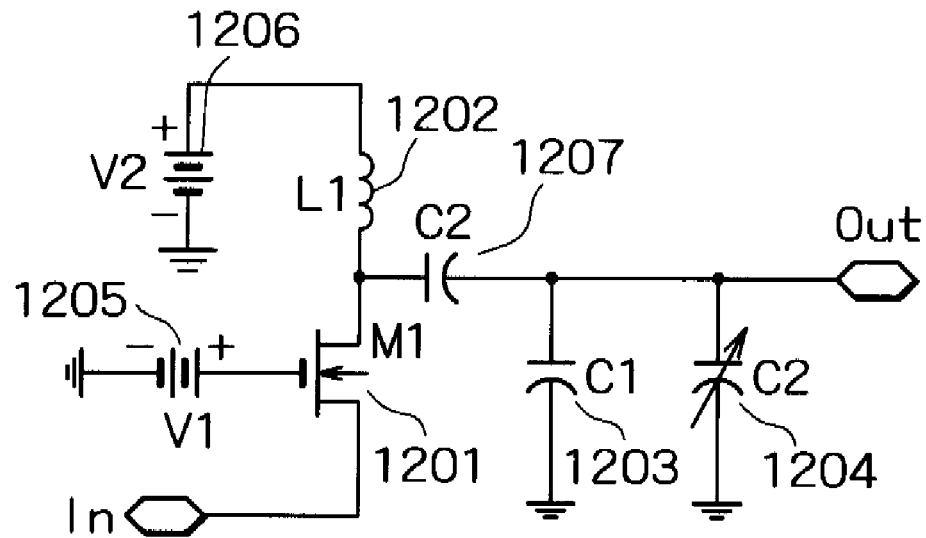
FIGS. 12A and 12B are circuit diagrams of a high-frequency amplification circuit according to a third embodiment of the invention.

FIG. 12A shows an example where the variable capacitor 1103 in FIG. 11A is replaced with a capacitor 1203 which has a fixed capacitance and a variable inductor 1204 is provided on the low side (ground side). As mentioned early, the provision of the variable inductor 1204 on the low side can permit the use of a low-resistance NMOS, which leads to preferable results, such as a reduction in Q value. An inductor 1202 serves to supply the drain current to a transistor 1201 and insulate the VDD power supply in an AC fashion. In this example, a capacitor 1207 is connected to a line which connects the drain terminal of the transistor 1201 to the output terminal Out and serves as AC coupling to block the direct current and couple to the alternate current.

Figure 12B:
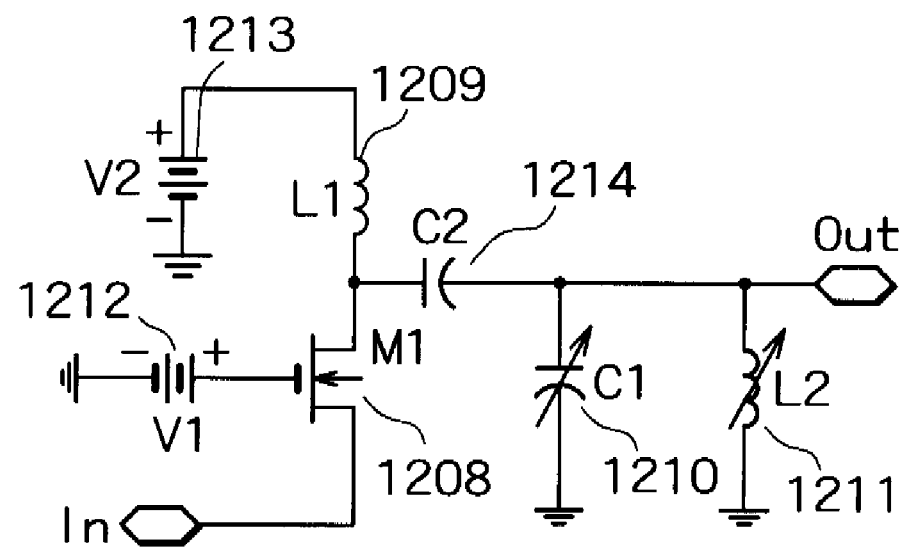

FIG. 12B shows a structure similar to that in FIG. 12A, where a capacitor 1210 corresponding to the fixed-capacitance capacitor 1203 in FIG. 12A is designed as a variable capacitor. A variable inductor 1211 corresponds to the variable inductor 1204 in FIG. 12A, and the other elements are identical to corresponding elements in FIG. 12A. Given that m is the number of types of capacitances that can be provided by the variable capacitor 1210 and n is the number of types of inductances that can be provided by the variable inductor 1211, a total of m×n types of resonance frequencies can be provided.

Figure 13A:
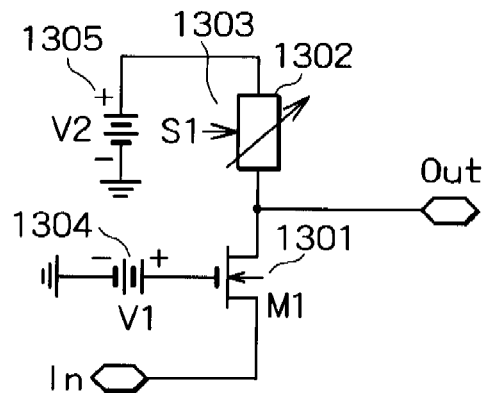
FIGS. 13A to 13C are circuit diagrams of a high-frequency amplification circuit according to a fourth embodiment of the invention.

FIG. 13A shows an example where a variable impedance element whose resonance frequency is variable is used as a load 1302 to be connected between the drain terminal of a transistor 1301 and a V2 power supply 1205. As mentioned above, the subject matter of the invention is to hop the resonance frequency (or the center frequency of the filter characteristic or the cut-off frequency) according to the hopping of the frequency of the input signal. The load 1302 is equivalently expressed by an inductance, a capacitance and a resistance or so. Therefore, the resonance frequency, the center frequency of the filter characteristic or the cut-off frequency can be switched at a high speed by switching those characteristics fast. The characteristics like the inductance, the capacitance and the resistance are changed by various ways, such as switching by means of a switch and changing the voltage or current. To change those characteristics, the circuit has some means of applying a control signal (S1) 1303 to the load 1302. The transistor 1301 operates as a gate-grounded circuit.

Figure 13B:
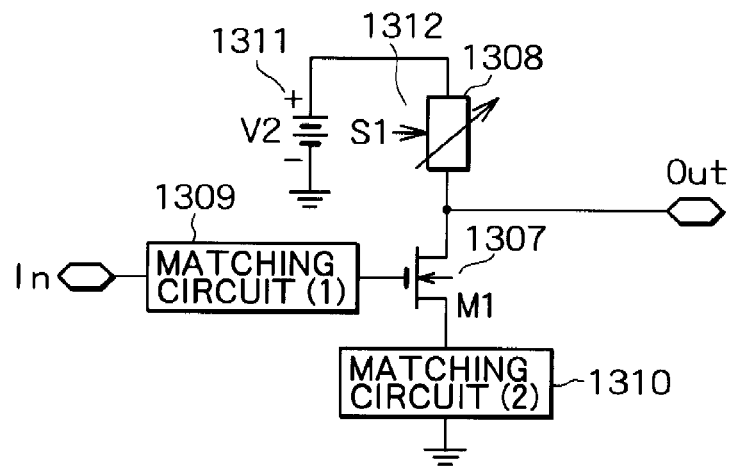

An example in which a transistor operates as a source-grounded circuit is shown in FIG. 13B. A transistor 1307 operates as a source-grounded circuit. Each of a matching circuit 1309 connected to the gate terminal of the transistor 1307 and a matching circuit 1310 connected to the source terminal of the transistor 1307 comprises an inductor, a capacitor and so forth, and its input impedance is matched to 50Ω. As a load 1308 to be connected between the drain terminal of the transistor 1307 and a V2 power supply 1311, a load whose resonance frequency (or the center frequency of the filter characteristic or the cut-off frequency) changes at a high speed is used as per the example shown in FIG. 13A.

Figure 13C:
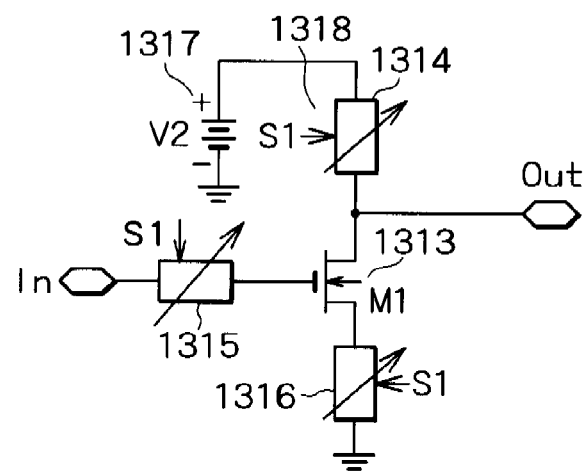

FIG. 13C shows a structure similar to that in FIG. 13B, which quickly changes the characteristics of a matching circuit 1315, connected to the gate terminal of a transistor 1313, and a matching circuit 1316, connected to the source terminal of the transistor 1313, according to the frequency hopping of the input signal. Normally, as the matching circuit uses an inductor and a capacitor, it is a narrow-band where the input impedance of 50Ω is obtainable if the characteristic impedance is 50Ω. While a structure which uses an inductor and a capacitor can acquire a high gain with low noise, its characteristic normally cannot be secured over a wide band. The structure of the example changes the characteristics of the matching circuits in accordance with the frequency and band of the input signal. Those characteristics are changed by various ways, such as switching by means of a switch and changing the voltage or current. A load 1314 to be connected between the drain terminal of the transistor 1313 and the V2 power supply 1311, like the load 1302 in FIG. 13A or the load 1308 in FIG. 13B, changes the characteristic according to the input signal using a control signal (S1) 1318.

An "input signal" used in the specification is any signal which is input to those LNAs. The input signal may be a signal to be supplied via an antenna on the reception side of a wireless circuit, or a signal to be supplied via a cable on the reception side in cable communication, to anywhere where a high-frequency signal in both wireless and cable transmission/reception circuits.

Figure 14B:
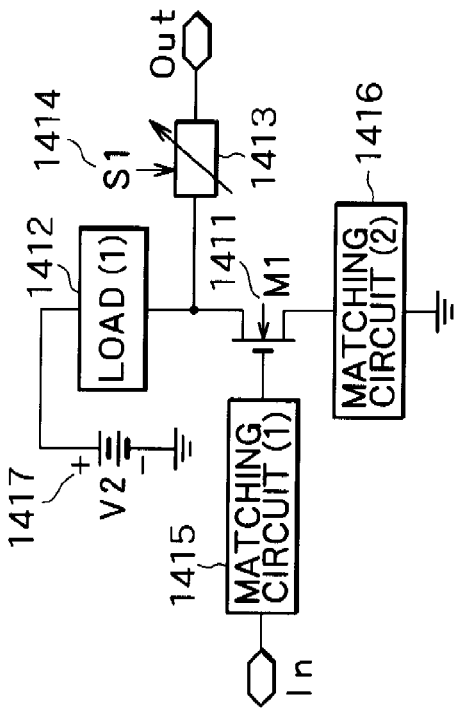
FIGS. 14A to 14D are circuit diagrams of a high-frequency amplification circuit according to a fifth embodiment of the invention.
Figure 14D:
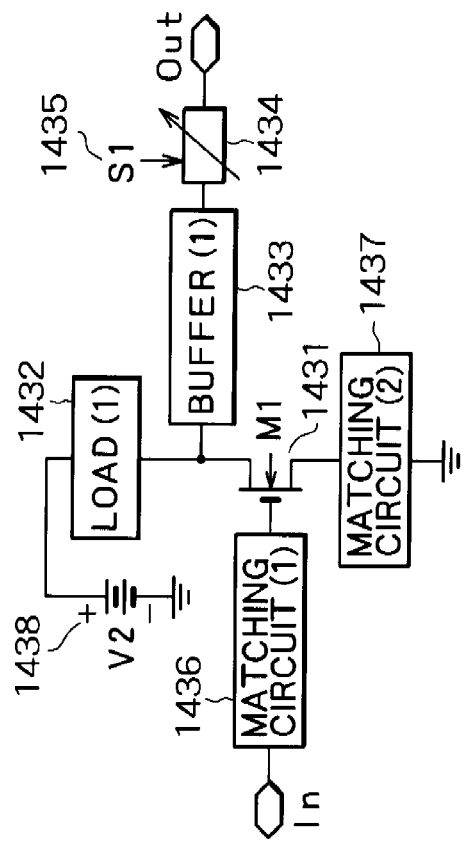
Figure 14A:
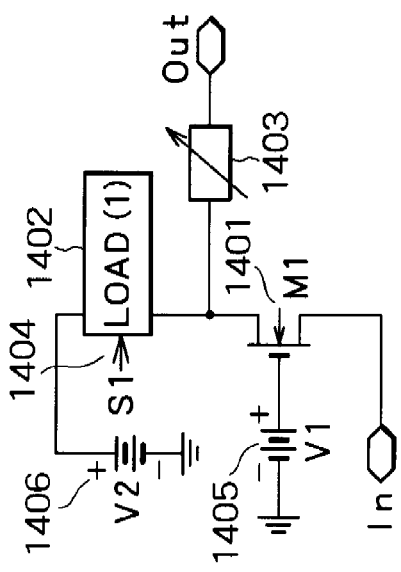

FIG. 14A shows an example in which the characteristic of a matching circuit 1403, which is connected between the drain terminal of a transistor 1401 and the output terminal Out and matches the output impedance with the characteristic impedance, is changed according to the frequency and band of the input signal. This example can be used when matching of the output with the transmission line is needed, as in a case where a signal is output outside the chip of the LNA. Like the example in FIG. 13C, the example in FIG. 14A hops the characteristic according to the input frequency by changing the inductance, the capacitance, the resistance or so in the matching circuit. The LNA which is comprised of the transistor 1401 and a load 1402 has such a structure as to amplify, for example, wide-band signals.

FIG. 14B shows a structure which, like the structure in FIG. 14A, achieves output matching using a source-grounded circuit. Specifically, a matching circuit 1415 is connected between the gate terminal of a transistor 1411 and the terminal In, and a matching circuit 1416 is connected between the source terminal of the transistor 1411 and the ground. The characteristic of a matching circuit 1413, which is connected between the drain terminal of the transistor 1411 and the terminal Out and matches the output impedance with the characteristic impedance, is changed according to the frequency and band of the input signal.

Figure 14C:
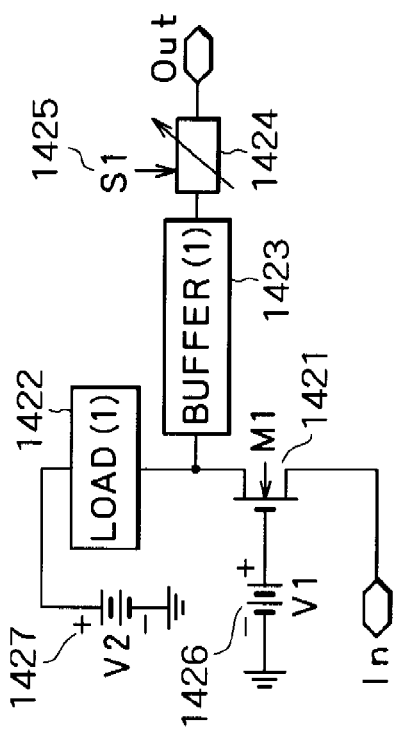

FIG. 14C shows an example where a buffer 1423 is connected between a load 1422, connected to the drain terminal of a transistor 1421, and a matching circuit 1424. The buffer 1423 is often needed to make the most of the high gain and low NF of the LNA. A source follower, which has a high input impedance and a low output impedance as explained earlier referring to FIG. 16, or the like can be used as the buffer 1423.

FIG. 14D shows an example which is the combination of the circuits in FIG. 14B and FIG. 14C. A matching circuit 1436 is connected between the gate terminal of a transistor 1431 and the terminal In, and a matching circuit 1437 is connected between the source terminal of the transistor 1431 and the ground. The characteristic of a matching circuit 1434, which is connected between the drain terminal of the transistor 1431 and the terminal Out and matches the output impedance with the characteristic impedance, is changed according to the frequency and band of the input signal. Further, a buffer 1433 is connected between a load 1432, connected to the drain terminal of the transistor 1431, and the matching circuit 1434.

Figure 15A:
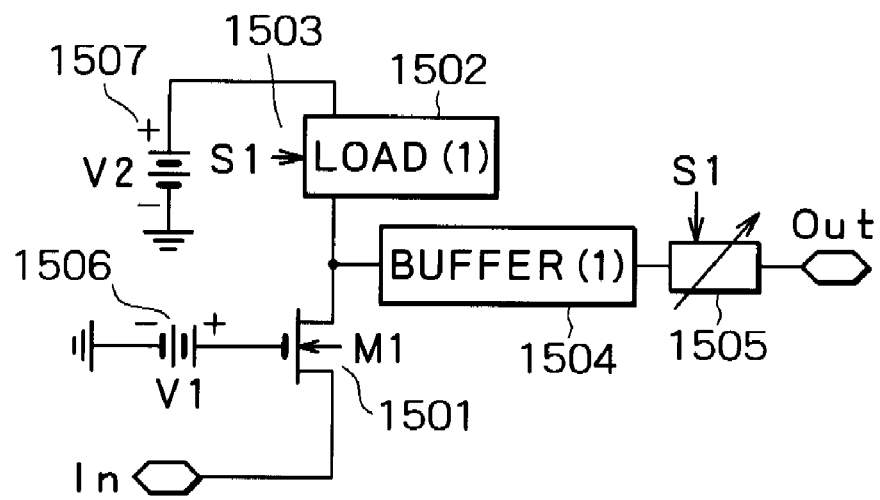
FIGS. 15A and 15B are circuit diagrams of a high-frequency amplification circuit according to a sixth embodiment of the invention.

FIG. 15A shows an example in which a filter 1505 whose filter characteristic changes fast is connected to a wide-band LNA which is comprised of a transistor 1501, a load 1502 connected to the drain terminal of the transistor 1501 and a buffer 1504. That is, the filter 1505 is connected between the buffer 1504 and the terminal Out. A filter which hops the center frequency of the band-pass characteristic fast or a filter which hops the cut-off frequency of the high-pass characteristic or low-pass characteristic fast is available as the filter 1505. This example can bring about effects similar to those of the first embodiment. The filter 1505 is equivalently expressed by an inductance, a capacitance, a resistance, etc., which and the resonance frequency or the center frequency or cut-off frequency of the filter characteristic can be changed over at a high speed by changing those inductance, capacitance, resistance and so forth. The characteristics, such as the inductance, capacitance and resistance, are changed by various ways, such as switching by means of a switch and changing the voltage or current.

Figure 15B:
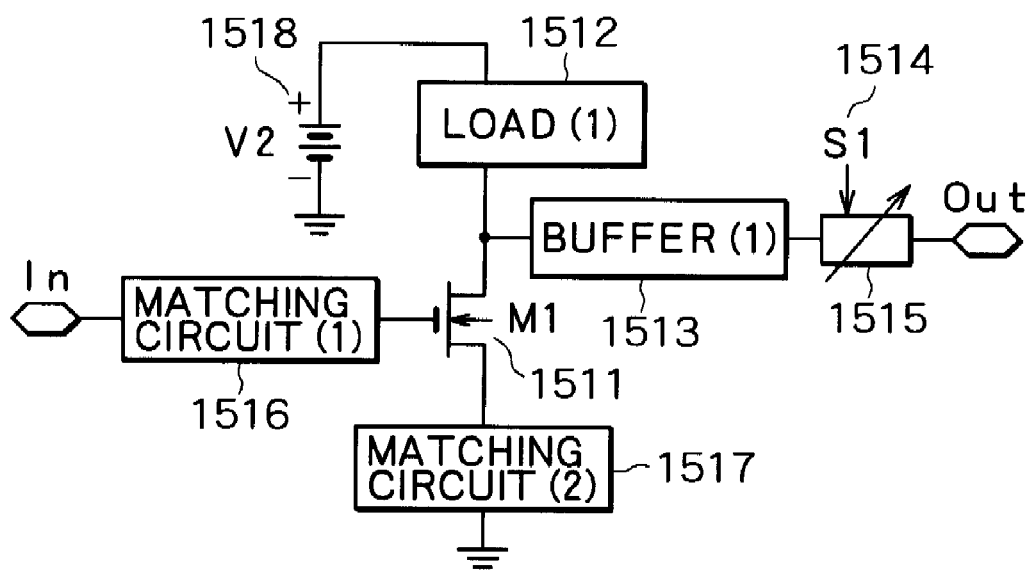

FIG. 15B shows an example in which a filter 1515 similar to the filter in FIG. 15A is connected to a source-ground type wide-band LNA which is expressed by a transistor 1511, a load 1512 and a buffer 1513. That is, a matching circuit 1516 is connected between the gate terminal of the transistor 1511 and the terminal In, and a matching circuit 1517 is connected between the source terminal of the transistor 1511 and the ground. Then, the resonance frequency or the center frequency or cut-off frequency of the filter characteristic can be changed fast by changing characteristic of the filter 1515, connected between the drain terminal of the transistor 1511 and the terminal Out, at a high speed. Further, the buffer 1513 is connected between the load 1512, connected to the drain terminal of the transistor 1511, and the filter 1515. The filter 1515, if given a characteristic similar to the characteristic of the filter 1505 in FIG. 15A, can provide similar effects obtained by the filter 1505.

Figure 19:
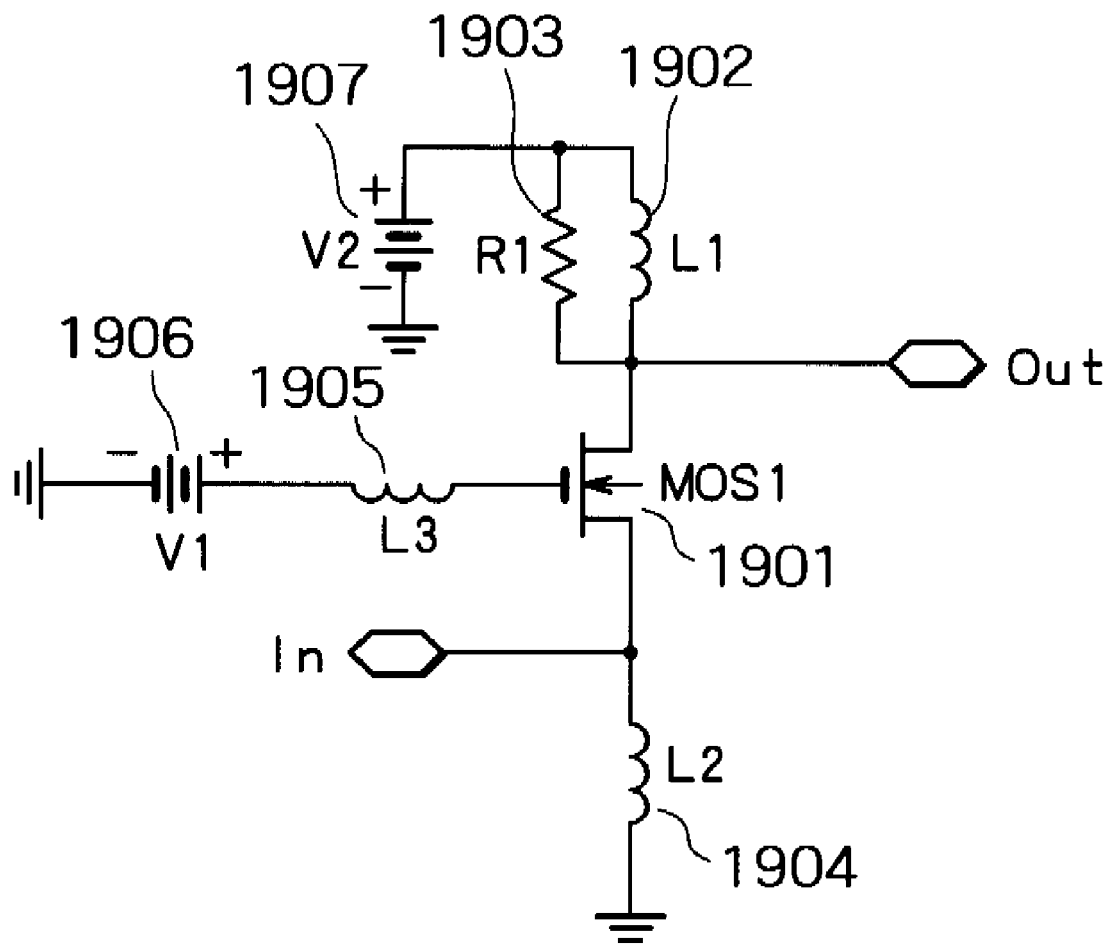
FIG. 19 is a circuit diagram of a high-frequency amplification circuit according to a seventh embodiment of the invention.

FIG. 19 is a circuit diagram of a wide-band LNA according to a further embodiment of the invention. A transistor 1901 corresponding to the transistor 107 in FIG. 1 operates as a gate-grounded circuit. An inductor 1904 connected to the source terminal of the transistor 1901 serves to let the bias current flow to the transistor 1901, and should preferably have an inductance high enough to be able to set the impedance between the source terminal and the ground high in an AC fashion. An inductor 1902, connected to the drain terminal of the transistor 1901, likewise serves to supply the bias current linearly at a low resistance and also to reduce the gain in the low region of the wide-band characteristic. For the same reason as applied to the inductor 1904, the inductor 1902 should preferably have a high inductance to some extent. In amplifying a frequency of 3 to 10 GHz or so, for example, the gain is not needed at a frequency of 3 GHz or lower and the gain around that frequency can be lowered by increasing the inductance the inductor 1902 to 6 nH or so. If the inductance of the inductor 1902 is set too high, the gain within the range of 3 to 10 GHz is also reduced. The inductor 1902 can be omitted. A resistor 1903 is the load of the transistor 1901. The use of a resistor, not an inductor, as the load can provide the gain characteristic which is less dependent on the frequency. An inductor 1905 connected to the gate terminal of the transistor 1901 brings about an effect of improving the characteristic in the high region of the wide-band characteristic and an effect of improving the NF in the wide band.

Figure 20A:
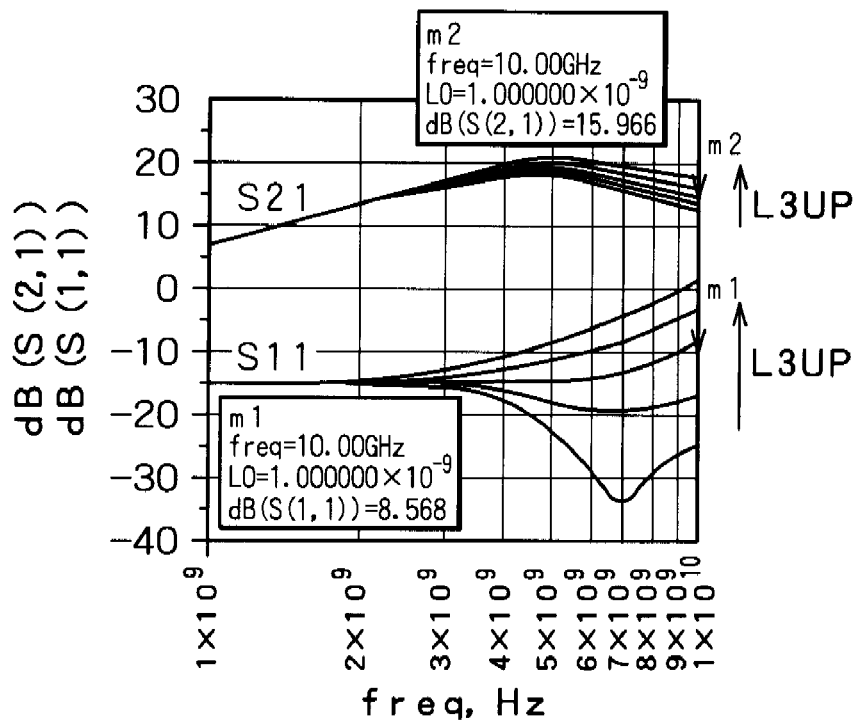
FIGS. 20A and 20B show characteristics of the seventh embodiment of the invention.
Figure 20B:
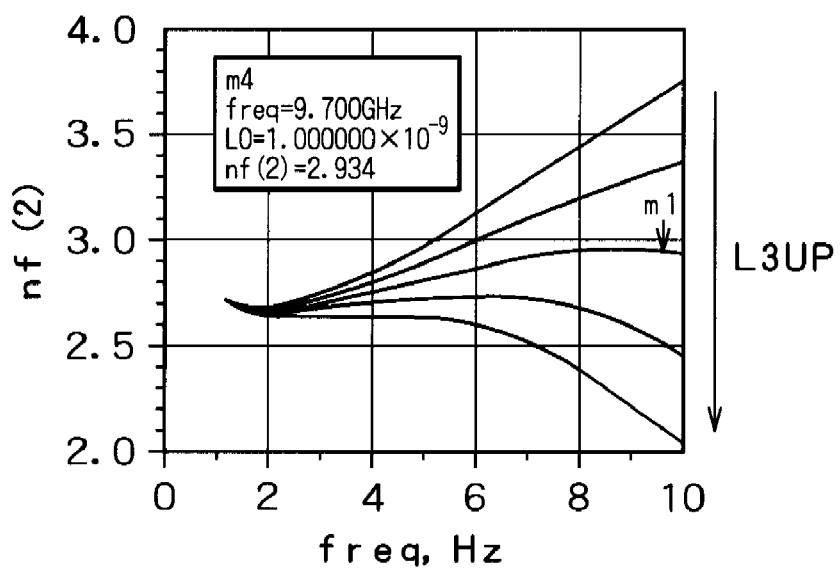

The demonstration of the effects are illustrated in FIGS. 20A and 20B. Increasing the inductance of the inductor 1905 makes the gain in the wide band larger as shown in FIG. 20A and makes the NF lower in the wide band. If the inductance of the inductor 1905 is made too high, the reflection characteristics S11 is deteriorated. The gain characteristic at 3 GHz or below is reduced by the effect of the inductor 1902. At this time, the inductor 1905 changes the characteristic over a range of 0 to 2 nH by a step of 0.5 nH. At this time, the transistor 1901 lets the current of 2.3 mA or so flow in a size of W/L=60 μm/0.18 μm. Power consumption of as low as 4.2 mW or so is obtained. It is apparent from FIGS. 20A and 20B that the proper inductance of the inductor 1905 is about 0.5 to 2 nH.

Figure 21:
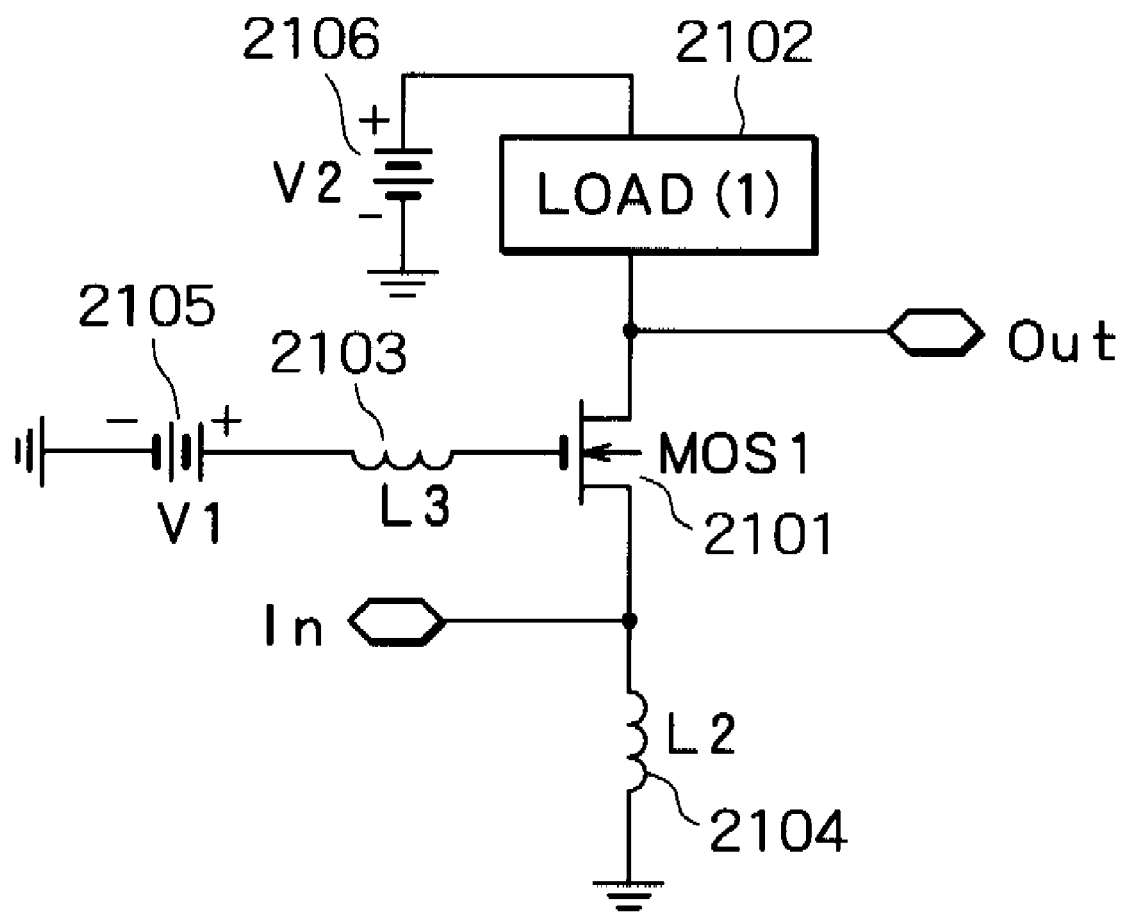
FIG. 21 is a circuit diagram of a high-frequency amplification circuit according to an eighth embodiment of the invention.

FIG. 21 shows an example where a load 2102, equivalently expressed by a resistor, an inductor and a capacitor, is connected to the drain terminal of a transistor 2101. The load 2102 is connected to in place of the inductor 1902 and the resistor 1903 in FIG. 19. The other structural elements, given different reference symbols though, are the same as corresponding elements in FIG. 19. The subject matter of this example is to make noise contained in the drain current or base current of the transistor 2101 harder to be visible by means of an inductor connected to the gate terminal or the base terminal of the transistor 2101. The characteristic of the load 2102 can be selected adequately according to the frequency and band of the input signal.

Figure 22:
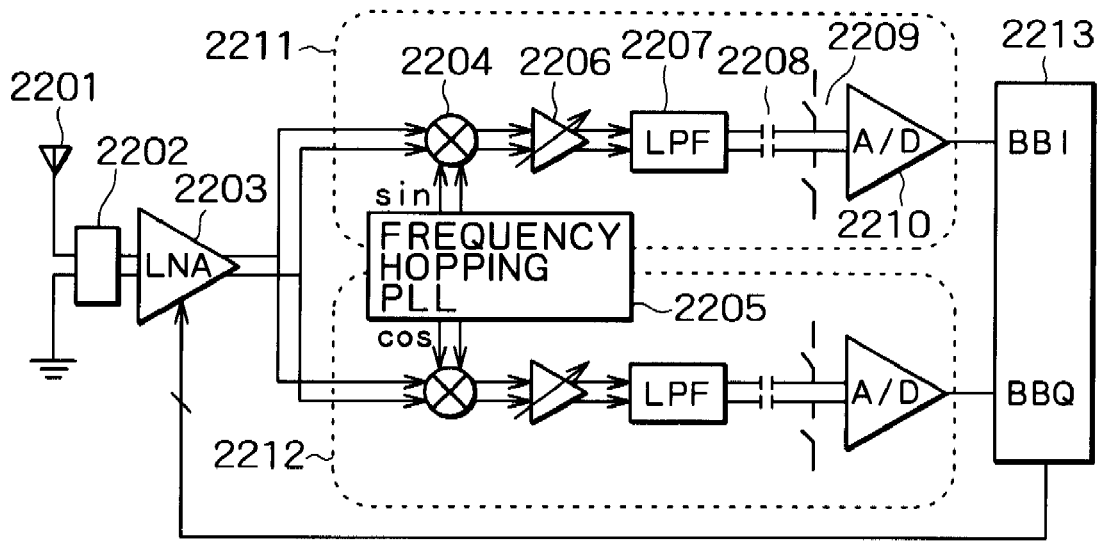
FIG. 22 is a block diagram of a receiver which uses the high-frequency amplification circuit according to the invention.

FIG. 22 is a block diagram of a receiver which uses the LNA according to the invention. A signal input from an antenna 2201 is separated into a component of a phase of 0 degree and a component of a phase of 180 degrees by a balun 2202 or the like. An LNA 2203 is a wide-band LNA according to the invention, and should preferably have a differential structure. In this example, the LNA 2203 is designed in such a way that a QPSK modulation signal is demodulated and the output of the LNA 2203 is coupled to an I path 2211 which demodulates an I signal and a Q path 2212 which demodulates a Q signal. A mixer 2204 should preferably be a double-balanced mixer which has a differential structure and performs mixing with a local signal. A frequency hopping PLL 2205 hops the frequencies f0 to f7 fast as shown in FIG. 5, and supplies the mixer 2204 with a local signal.

This example performs direct conversion of converting a high-frequency signal to a base-band signal, so that the output of the mixer 2204 is converted to a base-band signal. A gain control amplifier 2206 amplifies an arbitrary variable gain of the base-band signal. A low-pass filter 2207 plays a role of a channel separation filter as well as a role of reducing high-frequency noise. A capacitor 2208 is provided to cut the DC component and a switch 2209 is periodically reset to determine the input DC level of an A/D converter 2210. The A/D converter 2210 has a resolution of 5 to 10 bits and a conversion rate of 300 Msamples/s or so. Accordingly, digital data with a transfer rate of 600 Mbps or so both I and Q signals can be obtained. The Q path 2212 has a structure similar to the structure of the I path 2211.

A base-band processing circuit 2213 receives digital signals from the I path 2211 and the Q path 2212 and performs a media access process (MAC), such as demodulation and multi-access processing of a signal undergone a spreading process. The base-band processing circuit 2213 also performs a process, such as a training sequence, preamble, beaconing, for carrier recovery or clock recovery or the like, thereby reproducing the reference clock. The base-band processing circuit 2213 also generates a signal to control a switch which accomplishes hopping of the resonance frequency of the LNA and generates a voltage or a current in case of controlling the resonance frequency with the voltage or the current. Further, the base-band processing circuit 2213 can execute equalization to recover deterioration of a signal originated from fading or multi-path. The pattern of frequency hopping may be determined beforehand for each device, or can be acquired during a training sequence, a preamble process or a beaconing process.

In short, the use of a wide-band LNA according to the invention can realize a compact communication system which has low power consumption and a low BER and is unlikely to cause interference or is insusceptible to applied interference.

The high-frequency amplification circuit according to the invention is adaptable, as a wide-band amplification circuit for a wide band like UWB, to both wireless communication, which demands a high transfer rate, and cable communication.

What is claimed is:

1. A high-frequency amplification circuit comprising:
   a first transistor which receives as an input a signal to hop a frequency;
   a resonance circuit which is connected as a load to said first transistor and whose resonance frequency changes in synchronism with frequency switching of input signal frequency hopping, two sets of circuits each including said first transistor and said resonance circuit being provided;
   a baseband processing circuit which detects frequency switching timing of input signal frequency hopping and instructs said resonance circuit to switch the resonance frequency; and
   a switch which switches between outputs of said two sets of circuits in synchronism with said frequency switching of frequency hopping.

2. The high-frequency application circuit according to claim 1, wherein said resonance circuit includes an inductance element, a plurality of capacitance elements, and a plurality of switches connected to said plurality of capacitance elements.

3. The high-frequency amplification circuit according to claim 1, wherein said resonance circuit includes a capacitance element, a plurality of inductance elements, and a plurality of switches connected to said plurality of inductance elements.

4. The high-frequency amplification circuit according to claim 2, wherein said plurality of switches include: a plurality of second transistors to whose control terminals a first pulse for controlling said second transistors is applied; and
   a plurality of third transistors which are connected to said second transistors and to whose control terminals a second pulse having a polarity opposite to that of said first pulse is applied.

5. The high-frequency amplification circuit according to claim 3, wherein said plurality of switches include: a plurality of second transistors to whose control terminals a first pulse for controlling said second transistors is applied; and
   a plurality of third transistors which are connected to said second transistors and to whose control terminals a second pulse having a polarity opposite to that of said first pulse is applied.

6. The high-frequency amplification circuit according to claim 4, wherein said third transistors have a polarity opposite to that of said second transistors.

7. The high-frequency amplification circuit according to claim 5, wherein said third transistors have a polarity opposite to that of said second transistors.

8. The high-frequency amplification circuit according to claim 4, having a current mode logic using a differential configuration that generates said first pulse and said second pulse.

9. The high-frequency amplification circuit according to claim 5, having a current mode logic using a differential configuration that generates said first pulse and said second pulse.

10. The high-frequency amplification circuit according to claim 4, wherein said second transistors are NMOS transistors, and said third transistors are PMOS transistors.

11. The high-frequency amplification circuit according to claim 5, wherein said second transistors are NMOS transistors, and said third transistors are PMOS transistors.

12. A high-frequency amplification circuit comprising:
    a first transistor; and
    a resonance circuit including an inductance element and a plurality of capacitance elements, connected as loads to said first transistor, and a plurality of switches which changes that of said capacitance elements which is connected as a load;
    wherein there are two sets of circuits each including said first transistor, said inductance element, said plurality of capacitance elements and said plurality of switches, and a switch which switches between outputs of said two sets of circuits.

13. The high-frequency amplification circuit according to claim 12, wherein said plurality of switches include:
    a plurality of second transistors to whose control terminals a first pulse for controlling said second transistors is applied; and
    a plurality of third transistors which are connected to said second transistors and to whose control terminals a second pulse having a polarity opposite to that of said first pulse is applied.

14. The high-frequency amplification circuit according to claim 13, wherein said third transistors have a polarity opposite to that of said second transistors.

\* \* \* \* \*